(12) United States Patent
Min et al.

(10) Patent No.: US 12,111,699 B2
(45) Date of Patent: Oct. 8, 2024

(54) DISPLAY DEVICE HAVING HOLES IN LINE UNITS TO REDUCE CRACK PROPAGATION

(71) Applicant: LG Display Co., Ltd., Seoul (KR)

(72) Inventors: SungJoon Min, Goyang-si (KR); HaeYoon Jung, Seoul (KR); Sujin Ham, Seoul (KR); MyungSub Lim, Seoul (KR); YuRa Jeong, Seoul (KR); Heewon Kim, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/464,032

(22) Filed: Sep. 8, 2023

(65) Prior Publication Data

US 2024/0176394 A1 May 30, 2024

(30) Foreign Application Priority Data

Nov. 25, 2022 (KR) .......................... 10-2022-0160542

(51) Int. Cl.
*G06F 1/16* (2006.01)
*H05K 1/02* (2006.01)
*H10K 59/131* (2023.01)

(52) U.S. Cl.
CPC .......... *G06F 1/1652* (2013.01); *G06F 1/1601* (2013.01); *G06F 1/1656* (2013.01); *G06F 1/1637* (2013.01); *G06F 2200/1612* (2013.01); *H05K 1/0283* (2013.01); *H10K 59/131* (2023.02)

(58) Field of Classification Search
CPC .... G06F 1/1601; G06F 1/1652; G06F 1/1656; G06F 2200/1612; G06F 1/1637; H05K 1/0283; H10K 59/131
See application file for complete search history.

(56) References Cited

U.S. PATENT DOCUMENTS

| | | | |
|---|---|---|---|
| 11,271,179 B2 | 3/2022 | Kim et al. | |
| 2012/0062447 A1* | 3/2012 | Tseng | G02F 1/133305 345/33 |
| 2014/0055702 A1* | 2/2014 | Park | G02F 1/1333 257/40 |
| 2014/0217397 A1* | 8/2014 | Kwak | H01L 27/124 257/43 |
| 2016/0079336 A1* | 3/2016 | Youn | H01L 23/4985 257/40 |
| 2016/0268352 A1* | 9/2016 | Hong | H10K 59/131 |
| 2017/0110529 A1* | 4/2017 | Zhang | H10K 50/844 |
| 2017/0271617 A1* | 9/2017 | Choi | H10K 50/844 |
| 2018/0046221 A1* | 2/2018 | Choi | G06F 1/1652 |

(Continued)

FOREIGN PATENT DOCUMENTS

KR 10-2020-0009899 A 1/2020

*Primary Examiner* — Adam J Snyder
(74) *Attorney, Agent, or Firm* — Fenwick & West LLP

(57) ABSTRACT

According to an aspect of the present disclosure, a display device includes a stretchable lower substrate; a plurality of plate patterns on the lower substrate and spaced apart from each other, a plurality of line units between the plurality of plate patterns; a plurality of holes in a peak area of the plurality of line units; and a plurality of conductive members filled in the plurality of holes. Accordingly, the plurality of holes are formed in a peak area in which the stress is concentrated so that when the crack is generated, the crack may be blocked so as not to propagate to the other part of the line unit from the plurality of holes.

13 Claims, 18 Drawing Sheets

(56) References Cited

U.S. PATENT DOCUMENTS

| | | | | |
|---|---|---|---|---|
| 2018/0374912 A1* | 12/2018 | Zhang | .................. | G06F 3/0412 |
| 2020/0006397 A1* | 1/2020 | Park | .................... | H01L 27/1244 |
| 2020/0020273 A1* | 1/2020 | Hong | ...................... | G09G 3/32 |
| 2020/0028102 A1* | 1/2020 | Kim | ........................ | G09F 9/301 |
| 2021/0327798 A1* | 10/2021 | Qin | .......................... | G09F 9/30 |

\* cited by examiner (a)

(b)

(c)

DISPLAY DEVICE HAVING HOLES IN LINE UNITS TO REDUCE CRACK PROPAGATION

CROSS-REFERENCE TO RELATED APPLICATION

This application claims the benefit of Republic of Korea Patent Application No. 10-2022-0160542 filed on Nov. 25, 2022, which is hereby incorporated by reference in its entirety.

BACKGROUND

Field of Technology

The present disclosure relates to a display device, and more particularly to a stretchable display device which improves a stretching reliability of a stretching line.

Description of the Related Art

As display devices which are used for a monitor of a computer, a television, a cellular phone, or the like, there are an organic light emitting display (OLED) device which is a self-emitting device, a liquid crystal display (LCD) device which requires a separate light source, and the like.

An applicable range of the display device is diversified to personal digital assistants as well as monitors of computers and televisions and a display device with a large display area and a reduced volume and weight is being studied.

Recently, a display device which is manufactured by forming a display unit, a wiring line, and the like on a flexible substrate such as plastic which is a flexible material so as to be stretchable in a specific direction and changed in various forms is getting attention as a next generation display device.

SUMMARY

An object to be achieved by the present disclosure is to provide a display device which improves a stretching reliability of a line unit.

An object to be achieved by the present disclosure is to provide a display device which reduces a stress of a line unit during the stretching.

Still another object to be achieved by the present disclosure is to provide a display device which reduces the increase in a resistance of the line unit when the line unit is cracked.

Still another object to be achieved by the present disclosure is to provide a display device which reduces propagation of the crack of the line unit to the entire line unit.

Still another object to be achieved by the present disclosure is to provide a display device which reduces a disconnection of a line unit by forming a crack stopper in a peak area of a line unit in which a stress is concentrated.

Objects of the present disclosure are not limited to the above-mentioned objects, and other objects, which are not mentioned above, can be clearly understood by those skilled in the art from the following descriptions.

According to an aspect of the present disclosure, a display device includes a stretchable lower substrate; a plurality of plate patterns which is disposed on the lower substrate to be spaced apart from each other; a plurality of line units disposed between the plurality of plate patterns; a plurality of holes disposed in a peak area of the plurality of line units; and a plurality of conductive members filled in the plurality of holes. Accordingly, the plurality of holes is formed in a peak area in which the stress is concentrated so that when the crack is generated, the crack may be blocked so as not to propagate to the other part of the line unit from the plurality of holes.

According to another aspect of the present disclosure, a display device includes: a stretchable lower substrate; a plurality of plate patterns which is disposed on the lower substrate to be spaced apart from each other; a plurality of line patterns disposed between the plurality of plate patterns; a plurality of connection lines which is disposed on the plurality of line patterns and has a wavy shape; a plurality of crack stoppers disposed in a peak area of the plurality of connection lines; and a plurality of conductive members filled in the plurality of crack stoppers, the plurality of crack stoppers may be holes which pass through the plurality of connection lines. Accordingly, the crack stopper is formed in the plurality of connection lines to minimize the disconnection of the plurality of connection lines due to the crack.

Other detailed matters of the exemplary embodiments are included in the detailed description and the drawings.

According to the present disclosure, a crack stopper is disposed in a peak area of a line unit in which the stress is concentrated to improve a stretching reliability of the line unit.

According to the present disclosure, the disconnection of the line unit caused by the propagation of the crack generated in the line unit to the entire line unit may be minimized.

According to the present disclosure, when the line unit is cracked, a stress of the line unit is relieved while blocking the propagation of the crack to minimize the generation of additional crack.

According to the present disclosure, the increase of the resistance of the line unit in the vicinity of the crack stopper of the line unit may be reduced.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
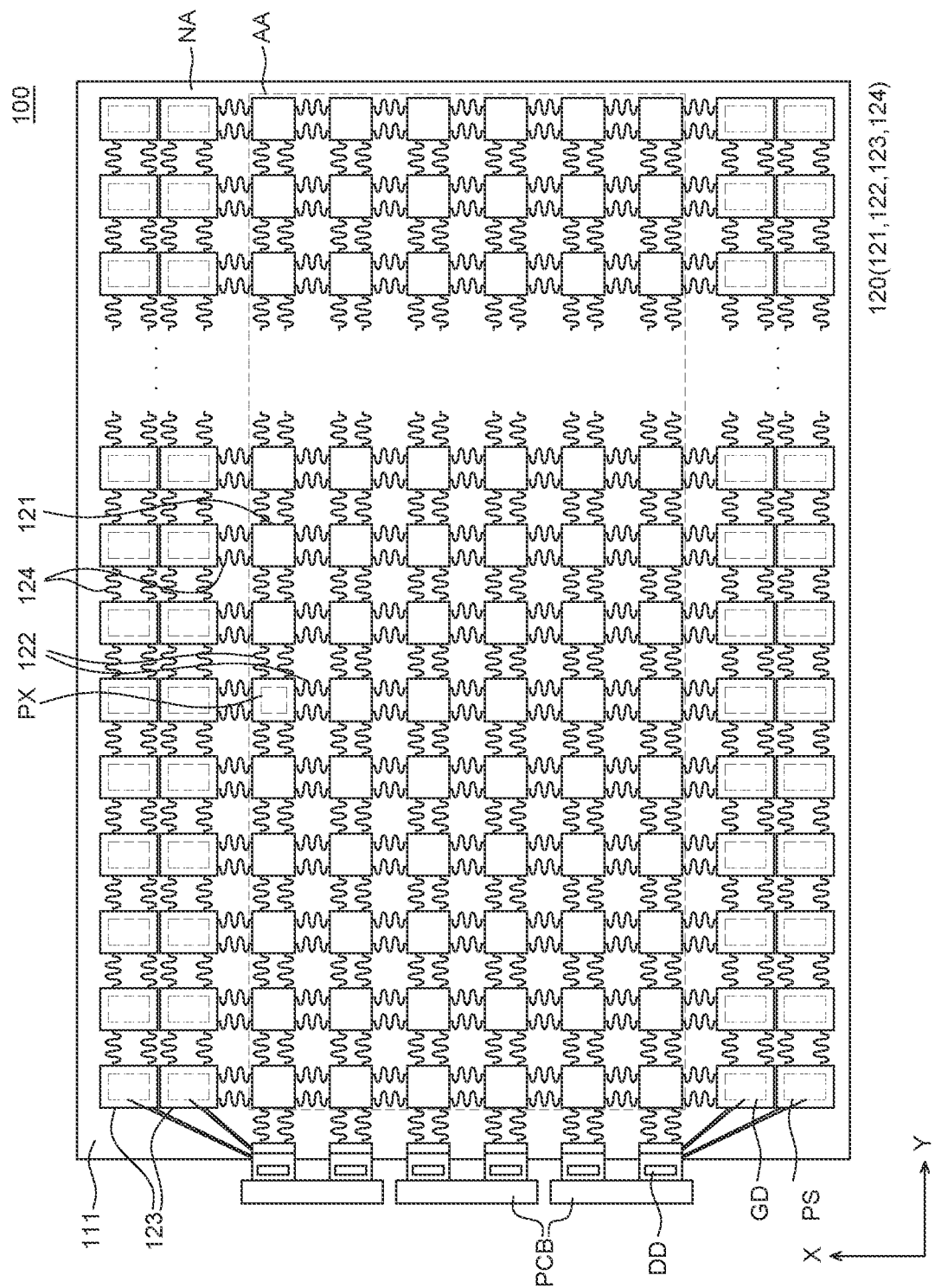
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
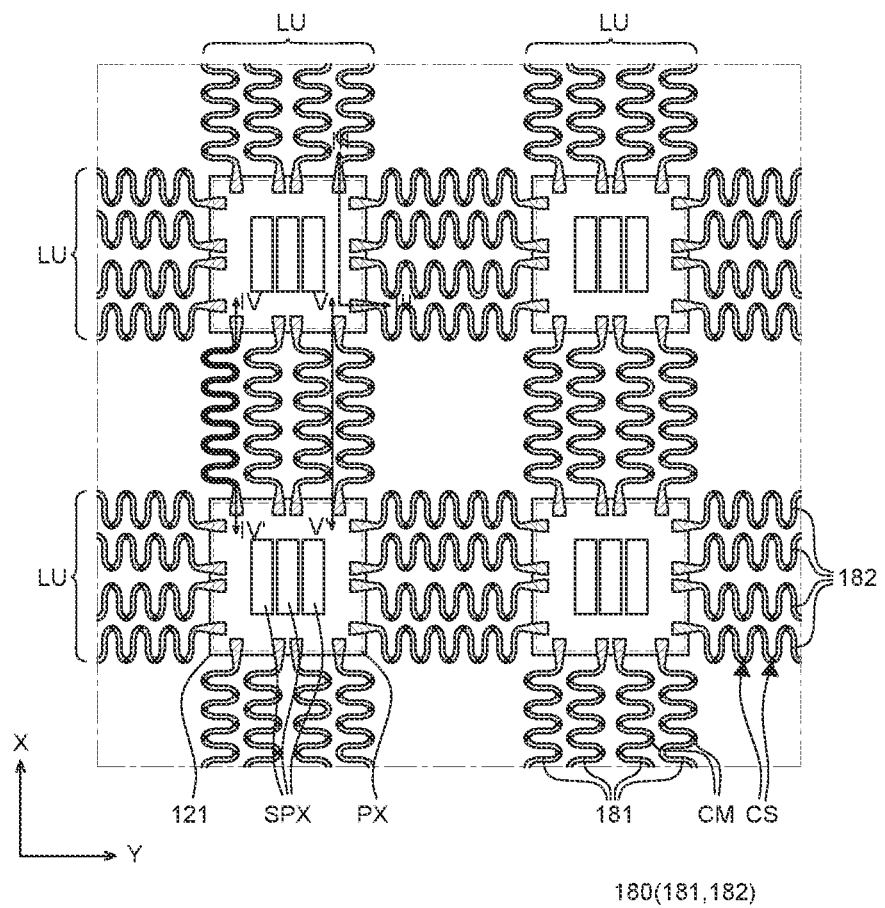
FIG. 2 is an enlarged plan view of an active area of a display device according to an exemplary embodiment of the present disclosure.
Figure 3:
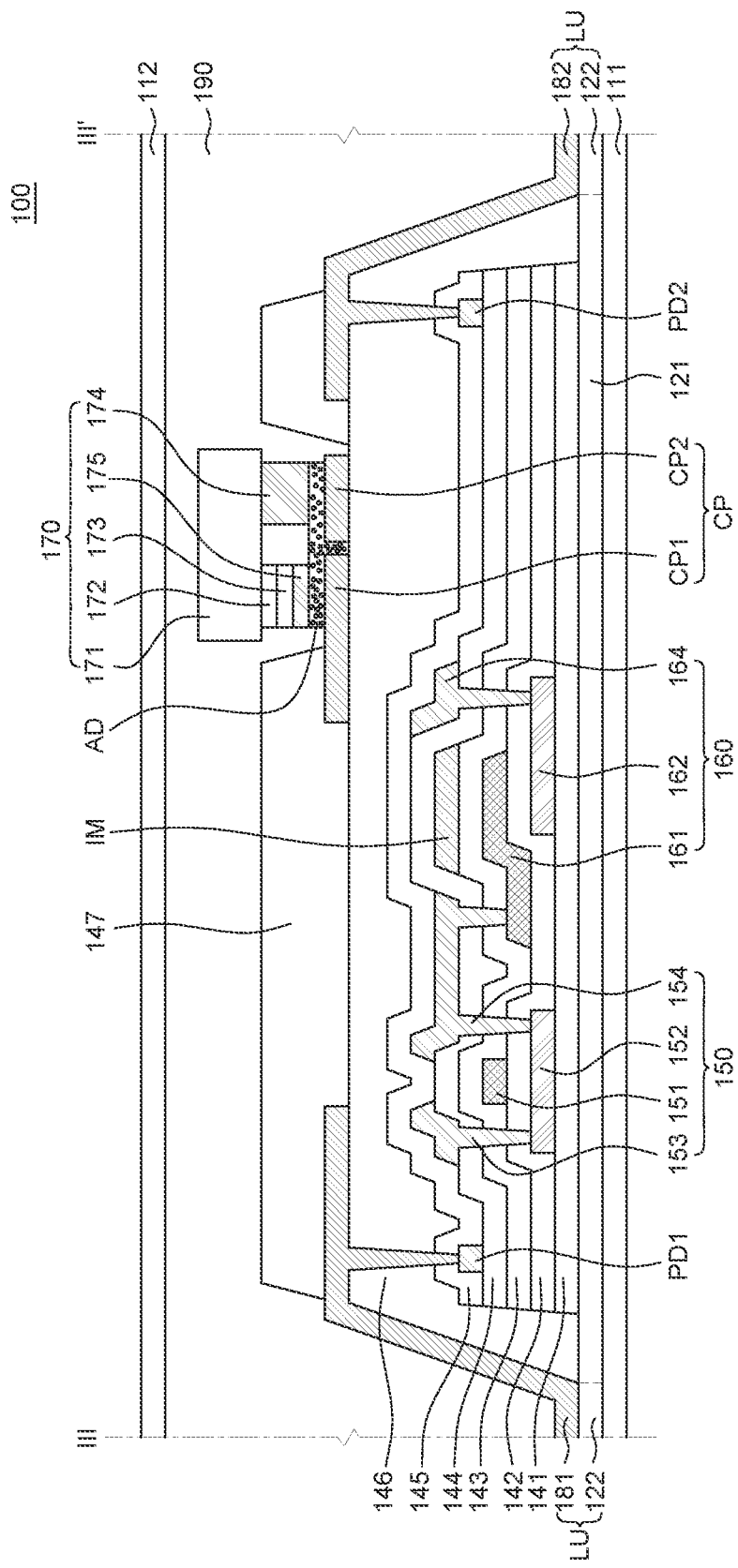
FIG. 3 is a cross-sectional view taken along the line III-III' of FIG. 2 according to an exemplary embodiment of the present disclosure.
Figure 4:
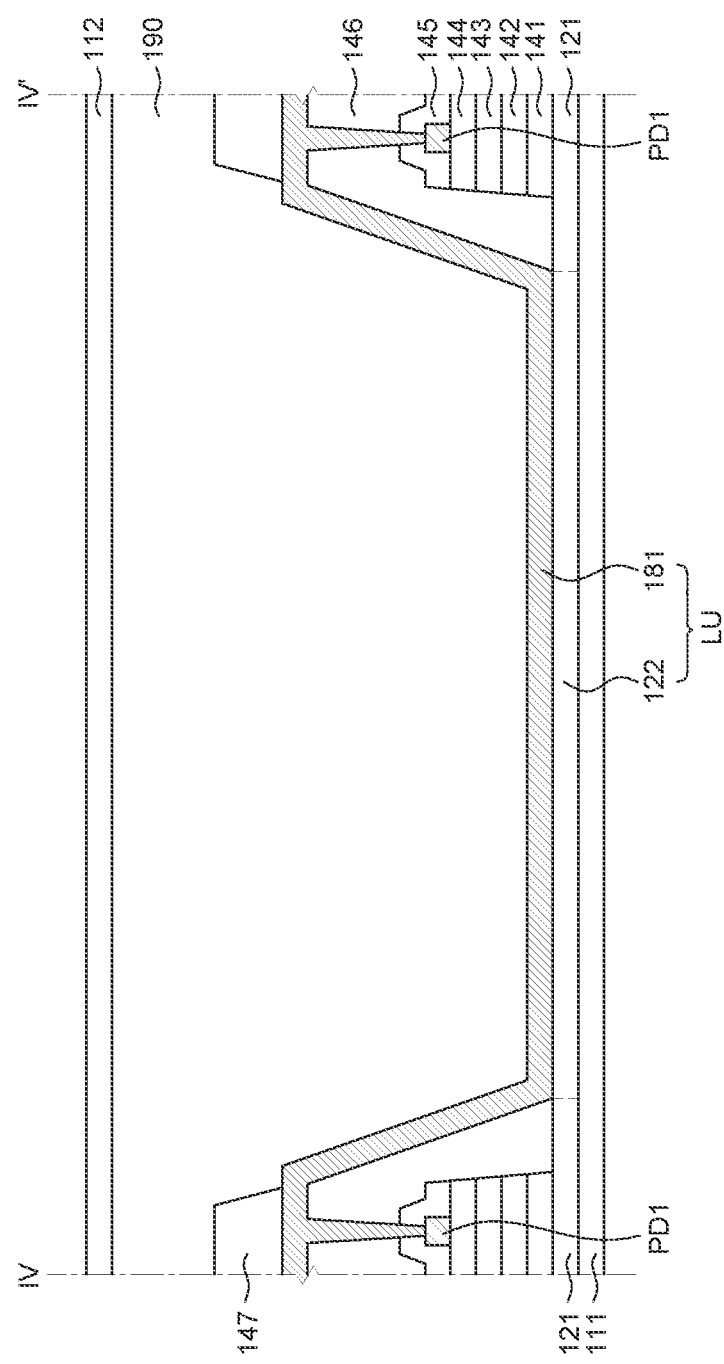
FIG. 4 is a cross-sectional view taken along IV-IV' of FIG. 2 according to an exemplary embodiment of the present disclosure.
Figure 5:
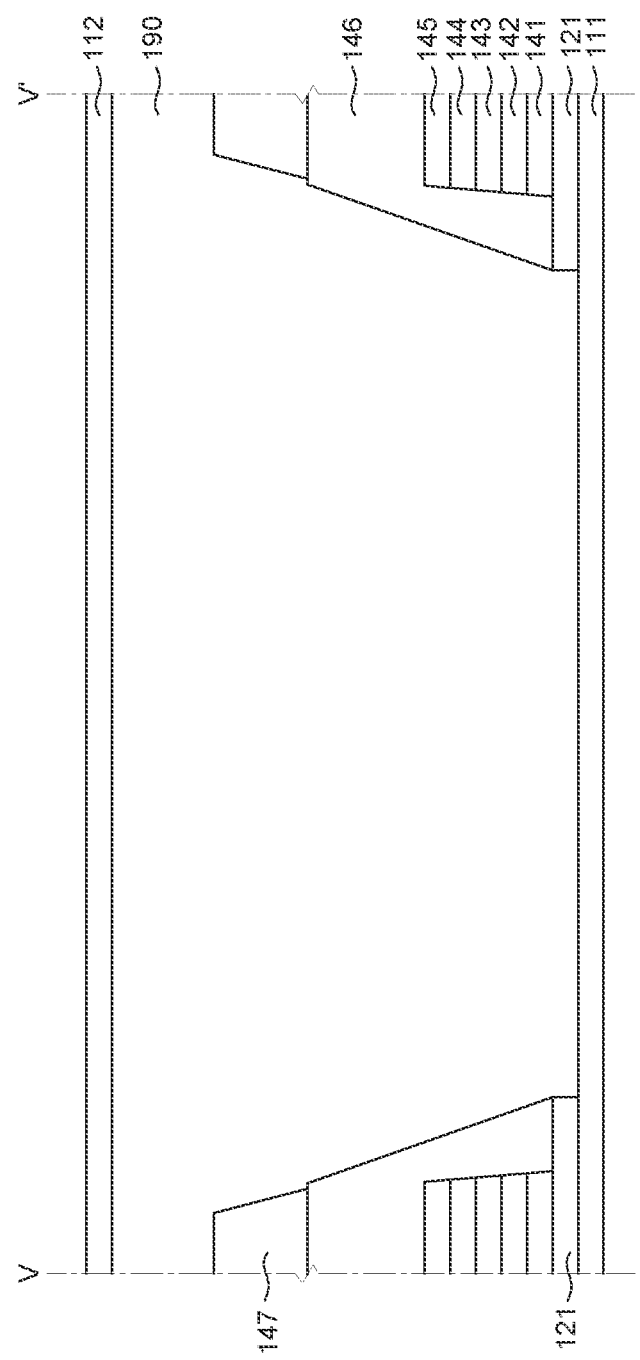
FIG. 5 is a cross-sectional view taken along the line V-V' of FIG. 2 according to an exemplary embodiment of the present disclosure.

FIG. 1 is a plan view of a display device according to an exemplary embodiment of the present disclosure. FIG. 2 is an enlarged plan view of an active area of a display device according to an exemplary embodiment of the present disclosure. FIG. 3 is a cross-sectional view taken along the line III-III' of FIG. 2 according to an exemplary embodiment of the present disclosure. FIG. 4 is a cross-sectional view taken along the line IV-IV' of FIG. 2 according to an exemplary embodiment of the present disclosure and FIG. 5 is a cross-sectional view taken along the line V-V' of FIG. 2 according to an exemplary embodiment of the present disclosure.

First, a display device 100 according to an exemplary embodiment of the present disclosure is a display device 100 which is capable of displaying images even in a bent or extended state and may be also referred to as a stretchable display device, a flexible display device and an extendable display device. As compared with the general display devices of the related art, the display device 100 has not only a high flexibility, but also stretchability. Therefore, the user may bend or extend a display device 100 and a shape of a display device 100 may be freely changed in accordance with manipulation of a user. For example, when the user pulls the display device 100 by holding ends of the display device, the display device 100 may be extended to the pulling direction of the user. Alternatively, when the user disposes the display device 100 on an outer surface which is not flat, the display device 100 may be disposed to be bent in accordance with the shape of the outer surface. Further, when a force applied by the user is removed, the display device 100 may return to its original shape.

Referring to FIGS. 1 to 3 together, the lower substrate 111 is a substrate which supports and protects several components of the display device 100. The lower substrate 111 may support the pattern layer 120 on which the pixels PX, the gate driver GD, and the power supply PS are formed.

The upper substrate 112 is a substrate which covers and protects several components of the display device 100. The upper substrate 112 may cover the pixels PX, the gate driver GD, and the power supply PS.

The lower substrate 111 and the upper substrate 112 which are flexible substrates may be configured by an insulating material which is bendable or extendable. For example, the lower substrate 111 and the upper substrate 112 may be formed of a silicon rubber such as polydimethylsiloxane (PDMS) or an elastomer such as polyurethane (PU) and polytetrafluoroethylene (PTFE) and thus have a flexibility. Further, the materials of the lower substrate 111 and the upper substrate 112 may be the same, but are not limited thereto and may vary.

The lower substrate 111 and the upper substrate 112 are ductile substrates so as to be reversibly expandable and contractible. Accordingly, the lower substrate 111 may be referred to as a lower stretchable substrate, a lower stretching substrate, a lower extending substrate, a lower ductile substrate, a lower flexible substrate, a first stretchable substrate, a first stretching substrate, a first extending substrate, a first ductile substrate, or a first flexible substrate. The upper substrate 112 may be referred to as an upper stretchable substrate, an upper stretching substrate, an upper extending substrate, an upper ductile substrate, an upper flexible substrate, a second stretchable substrate, a second stretching substrate, a second extending substrate, a second ductile substrate, or a second flexible substrate.

Moduli of elasticity of the lower substrate 111 and the upper substrate 112 may be several MPa to several hundreds of MPa. Further, a ductile breaking rate of the lower substrate 111 and the upper substrate 112 may be 100% or higher. Here, the ductile breaking rate refers to a stretching rate at a timing when an object to be stretched is broken or cracked. A thickness of the lower substrate 111 may be 10 μm to 1 mm, but is not limited thereto.

The lower substrate 111 may have an active area AA and a non-active area NA enclosing the active area AA. However, the active area AA and the non-active area NA are not mentioned to be limited to the lower substrate 111, but mentioned for the entire display device 100.

The active area AA is an area in which images are displayed in the display device 100 and a plurality of pixels PX is disposed in the active area AA. Each pixel PX may include a display element and various driving elements for driving the display element. Various driving elements may refer to at least one thin film transistor (TFT) and a capacitor, but are not limited thereto. The plurality of pixels PX may be connected to various wiring lines, respectively. For example, each of the plurality of pixels PX may be connected to various wiring lines, such as a gate line, a data line, a high potential voltage line, a low potential voltage line, a reference voltage line, and an initialization voltage line.

The non-active area NA is an area where no image is displayed. The non-active area NA may be an area adjacent to the active area AA. The non-active area NA may be adjacent to the active area AA to enclose the active area AA. However, it is not limited thereto so that the non-active area NA corresponds to an area excluding the active area AA from the lower substrate 111 and may be modified and separated in various forms. In the non-active area NA, various components for driving a plurality of pixels PX disposed in the active area AA, such as a gate driver GD and a power supply PS, may be disposed. In the non-active area NA, a plurality of pads connected to the data driver DD and the printed circuit board PCB may be disposed and each pad may be connected to each of the plurality of pixels PX of the active area AA.

The pattern layer 120 may be disposed on the lower substrate 111. The pattern layer 120 may include a plurality of first plate patterns 121 and a plurality of first line patterns 122 disposed in the active area AA and a plurality of second plate patterns 123 and a plurality of second line patterns 124 disposed in the non-active area NA.

A plurality of plate patterns 121 and 123 is disposed in the active area AA and the non-active area NA. The plurality of plate patterns 121 and 123 includes a plurality of first plate patterns 121 and a plurality of second plate patterns 123. The plurality of first plate patterns 121 is disposed in the active area AA of the lower substrate 111 and the plurality of second plate patterns 123 is disposed in the non-active area NA of the lower substrate 111. On the plurality of first plate patterns 121, a plurality of pixels PX is formed and on the plurality of second plate patterns 123, a gate driver GD and a power supply PS may be formed.

The plurality of first plate patterns 121 and the plurality of second plate patterns 123 may be disposed in the form of separate islands. The plurality of first plate patterns 121 and the plurality of second plate patterns 123 may be individually separated. Therefore, the plurality of first plate patterns 121 and the plurality of second plate patterns 123 may be referred to as first island patterns and second island patterns or first individual patterns and second individual patterns.

Referring to FIG. 1, a size of each of the plurality of second plate patterns 123 may be larger than a size of each of the plurality of first plate patterns 121. In each of the plurality of second plate patterns 123, one stage of the gate driver GD may be disposed. Therefore, an area occupied by various circuit configurations which configure one stage of the gate driver GD may be relatively larger than an area occupied by one pixel PX so that a size of each of the plurality of second plate patterns 123 may be larger than a size of each of the plurality of first plate patterns 121.

In the meantime, even though it is illustrated in FIG. 1 that the plurality of second plate patterns 123 is disposed in the non-active area NA on both sides of the active area AA in the first direction X, this is illustrative so that the plurality of second plate patterns 123 may be disposed in an arbitrary area of the non-active area NA. Further, even though it is illustrated that the plurality of first plate patterns 121 and the plurality of second plate patterns 123 have a square shape, they are not limited thereto and the shapes of the plurality of first plate patterns 121 and the plurality of second plate patterns 123 may vary in various forms.

Referring to FIGS. 1 and 2, a plurality of line patterns 122 and 124 is disposed in the active area AA and the non-active area NA. The plurality of line patterns 122 and 124 includes a plurality of first line patterns 122 and a plurality of second line patterns 124. The plurality of first line patterns 122 is disposed in the active area AA. The plurality of first line patterns 122 is patterns which connect first plate patterns 121 which are adjacent to each other and may be referred to as internal connection patterns. That is, the plurality of first line patterns 122 may be disposed between the plurality of first plate patterns 121.

The plurality of second line patterns 124 of the pattern layer 120 is disposed in the non-active area NA. The plurality of second line patterns 124 connects the first plate pattern 121 and the second plate pattern 123 which are adjacent to each other or connects a plurality of adjacent second plate patterns 123 and may be referred to as external connection patterns. The plurality of second line patterns 124 may be disposed between the first plate pattern 121 and the second plate pattern 123 which are adjacent to each other and between the plurality of second plate patterns 123 which is adjacent to each other.

The plurality of first line patterns 122 and the plurality of second line patterns 124 have a wavy shape. For example, the plurality of first line patterns 122 and the plurality of second line patterns 124 may have a sinusoidal shape. However, the shape of the plurality of first line patterns 122 and the plurality of second line patterns 124 is not limited thereto. For example, the plurality of first line patterns 122 and the plurality of second line patterns 124 may extend in a zigzag pattern. Further, the plurality of first line patterns 122 and the plurality of second line patterns 124 may have various shapes such as a shape in which a plurality of rhombic substrates is connected at their vertexes to be extended or a shape in which semicircular and quadrant-shaped substrates are connected to each other. Further, the number and the shape of the plurality of first line patterns 122 and the plurality of second line patterns 124 illustrated in FIG. 1 are examples and may be changed in various forms depending on the design.

In the meantime, the plurality of first plate patterns 121, the plurality of first line patterns 122, the plurality of second plate patterns 123, and the plurality of second line patterns 124 are rigid patterns. That is, the plurality of first plate patterns 121, the plurality of first line patterns 122, the plurality of second plate patterns 123, and the plurality of second line patterns 124 may be more rigid than the lower substrate 111 and the upper substrate 112.

The plurality of first plate patterns 121, the plurality of first line patterns 122, the plurality of second plate patterns 123, and the plurality of second line patterns 124 which are rigid substrates may be formed of a plastic material having a lower flexibility than the lower substrate 111 and the upper substrate 112. For example, the plurality of first plate patterns 121, the plurality of first line patterns 122, the plurality of second plate patterns 123, and the plurality of second line patterns 124 may be formed of at least one material of polyimide (PI), polyacrylate, and polyacetate. When the plurality of first plate patterns 121, the plurality of first line patterns 122, the plurality of second plate patterns 123, and the plurality of second line patterns 124 are formed of the same material, the plurality of first plate patterns 121, the plurality of first line patterns 122, the plurality of second plate patterns 123, and the plurality of second line patterns 124 may be integrally formed. However, when the plurality of first plate patterns 121, the plurality of first line patterns 122, the plurality of second plate patterns 123, and the plurality of second line patterns 124 may be formed of different materials, but are not limited thereto.

Moduli of elasticity of the plurality of first plate patterns 121, the plurality of first line patterns 122, the plurality of second plate patterns 123, and the plurality of second line patterns 124 may be higher than a modulus of elasticity of the lower substrate 111. The modulus of elasticity is a parameter representing a rate of deformation against the stress applied to the substrate and the higher the modulus of elasticity, the higher the hardness. Therefore, the plurality of first plate patterns 121, the plurality of first line patterns 122, the plurality of second plate patterns 123, and the plurality of second line patterns 124 may be referred to as a plurality of first rigid patterns, a plurality of second rigid patterns, a plurality of third rigid patterns, and a plurality of fourth rigid patterns, respectively. Moduli of elasticity of the plurality of first plate patterns 121, the plurality of first line patterns 122, the plurality of second plate patterns 123, and the plurality of second line patterns 124 may be 1000 times higher than the moduli of elasticity of the lower substrate 111 and the upper substrate 112, but it is not limited thereto.

In the meantime, in some exemplary embodiments, the lower substrate 111 may be defined to include a plurality of first lower patterns and a second lower pattern. The plurality of first lower patterns may be an area of the lower substrate 111 overlapping the plurality of first plate patterns 121 and the plurality of second plate patterns 123. The second lower pattern may be a remaining area which does not overlap the plurality of first plate patterns 121 and the plurality of second plate patterns 123.

Further, the upper substrate 112 may be defined to include a plurality of first upper patterns and a second upper pattern. The plurality of first upper patterns may be an area of the upper substrate 112 overlapping the plurality of the first plate patterns 121 and the plurality of second plate patterns 123, but the second upper pattern may be a remaining area which does not overlap the plurality of the first plate patterns 121 and the plurality of second plate patterns 123.

At this time, moduli of elasticity of the plurality of first lower patterns and the first upper pattern may be higher than moduli of elasticity of the second lower pattern and the second upper pattern. For example, the plurality of first lower patterns and the first upper pattern may be formed of the same material as the plurality of first plate patterns 121 and the plurality of second plate patterns 123. The second lower pattern and the second upper pattern may be formed of a material having a modulus of elasticity lower than those of the plurality of first plate patterns 121 and the plurality of second plate patterns 123.

For example, the first lower pattern and the first upper pattern may be formed of polyimide (PI), polyacrylate, or polyacetate. Further, the second lower pattern and the second upper pattern may be formed of silicon rubber such as polydimethylsiloxane (PDMS) or elastomer such as polyurethane (PU) or polytetrafluoroethylene.

The gate driver GD may be mounted on the plurality of second plate patterns 123. The gate driver GD may be formed on the plurality of second plate patterns 123 in a gate in panel (GIP) manner when various elements on the plurality of first plate patterns 121 are manufactured. Therefore, various circuit configurations which configure the gate driver GD, such as transistors, capacitors, and wiring lines, may be disposed on the plurality of second plate patterns 123. One stage which is a circuit which configures the gate driver GD and includes transistors and capacitors may be disposed above each of the plurality of second plate patterns 123. However, the gate driver GD may be mounted in a chip on film (COF) manner, but is not limited thereto.

The power supply PS may be disposed on the plurality of second plate patterns 123. The power supply PS may be formed on the second plate pattern 123 adjacent to the gate driver GD. The power supply PS is a plurality of power blocks patterned when various components on the first plate pattern 121 is manufactured and may be formed on the second plate pattern 123. The power supply PS is electrically connected to the gate driver GD of the non-active area NA and the plurality of pixels PX of the active area AA to supply a driving voltage. Specifically, the power supply PS is electrically connected to the gate driver GD formed on the second plate pattern 123 and the plurality of pixels PX formed on the first plate pattern 121 by means of the second line pattern 124 and the first line pattern 122. For example, the power supply PS may supply a gate driving voltage and a clock signal to the gate driver GD. The power supply PS may supply the power voltage to each of the plurality of pixels PX.

The printed circuit board PCB is connected to the edge of the lower substrate 111. The printed circuit board PCB is a component which transmits signals and voltages for driving the display element from the control unit to the display element. Therefore, the printed circuit board PCB may also be referred to as a driving substrate. A control unit such as an integrated circuit (IC) chip or a circuit unit may be mounted on the printed circuit board PCB. Further, on the printed circuit board PCB, a memory, a processor, or the like may also be mounted. The printed circuit board PCB provided in the display device 100 may include a stretching area and a non-stretching area to ensure stretchability. In the non-stretching area, an IC chip, a circuit unit, a memory, and a processor are mounted and in the stretching area, wiring lines which are electrically connected to the IC chip, the circuit unit, the memory, and the processor may be disposed.

The data driver DD is a component which supplies a data voltage to the plurality of pixels PX disposed in the active area AA. The data driver DD may be configured as an IC chip so that it may be also referred to as a data integrated circuit D-IC. The data driver DD may be mounted in the non-stretching area of the printed circuit board PCB. That is, the data driver DD may be mounted on the printed circuit board PCB in the form of a chip on board (COB). However, even though in FIG. 1, it is illustrated that the data driver DD is mounted in a COB manner, the data driver DD may be mounted by a chip on board (COB), a chip on glass (COG), or a tape carrier package (TCP) manner, but it is not limited thereto.

Further, even though in FIG. 1, one data driver DD is disposed so as to correspond to each of a plurality of columns formed by the plurality of first plate patterns 121 disposed in the active area AA, it is not limited thereto. That is, one data driver DD may be disposed so as to correspond to a plurality of columns formed by the plurality of first plate patterns 121.

Referring to FIGS. 1 and 2, the plurality of first plate patterns 121 is spaced apart from each other to be disposed on the active area AA of the lower substrate 111. For example, as illustrated in FIG. 1, the plurality of first plate patterns 121 may be disposed on the lower substrate 111 in a matrix, but is not limited thereto. The plurality of first line patterns 122 may connect the plurality of first plate patterns 121. Some of the plurality of first line patterns 122 may connect a plurality of first plate patterns 121 which is adjacent to each other in a first direction X and the other may connect a plurality of first plate patterns 121 which is adjacent to each other in a second direction Y.

Referring to FIGS. 2 and 3, a pixel PX including the plurality of sub pixels SPX which is an individual unit emitting the light is disposed in the plurality of first plate patterns 121. Each of the plurality of sub pixels SPX may include an LED 170 which is a display element and a driving transistor 160 and a switching transistor 150 which drive the LED 170. However, in the sub pixel SPX, the display element is not limited to an LED 170, and may also be changed to an organic light emitting diode. For example, the plurality of sub pixels SPX may include a red sub pixel, a green sub pixel, and a blue sub pixel, but is not limited thereto and colors of the plurality of sub pixels SPX may be modified to various colors as needed.

Hereinafter, a cross-sectional structure of the active area AA will be described in detail with reference to FIG. 3.

Referring to FIG. 3, a plurality of inorganic insulating layers are disposed on the plurality of first plate patterns 121. For example, a plurality of inorganic insulating layers may include a buffer layer 141, a gate insulating layer 142, a first interlayer insulating layer 143, a second interlayer insulating layer 144, and a passivation layer 145. However, in addition to the above-described inorganic insulating layer, another inorganic insulating layer may be additionally disposed or one or more of the above-described inorganic insulating layers may be omitted and a configuration of the plurality of inorganic insulating layers is not limited thereto.

First, the buffer layer 141 is disposed on the plurality of first plate patterns 121. The buffer layer 141 is formed on the plurality of first plate patterns 121 to protect various components of the display device 100 from permeation of moisture and oxygen from the outside of the lower substrate 111 and the plurality of first plate patterns 121. The buffer layer 141 may be configured by an insulating material. For example, the buffer layer 141 may be configured by a single layer or a double layer formed of at least one of silicon nitride (SiNx), silicon oxide (SiOx), and silicon oxynitride (SiON). However, the buffer layer 141 may be omitted depending on a structure or a characteristic of the display device 100.

At this time, the buffer layer 141 may be formed in an area where the lower substrate 111 overlaps the plurality of first plate patterns 121 and the plurality of second plate patterns 123. As described above, the buffer layer 141 may be formed of an inorganic material so that the buffer layer 141 may be easily cracked or damaged during a process of stretching the display device 100. Therefore, the buffer layer 141 is not formed in an area between the plurality of first plate patterns 121 and the plurality of second plate patterns 123. Instead, the buffer layer 141 is patterned to have a shape of the plurality of first plate patterns 121 and the plurality of second plate patterns 123 to be disposed only above the plurality of first plate patterns 121 and the plurality of second plate patterns 123. Therefore, in the display device 100 according to the exemplary embodiment of the present disclosure, the buffer layer 141 is formed only in an area overlapping the plurality of first plate patterns 121 and the plurality of second plate patterns 123 which are rigid patterns. Therefore, even though the display device 100 is bent or extended to be deformed, the damage to various components of the display device 100 may be suppressed.

Referring to FIG. 3, a switching transistor 150 and a driving transistor 160 are formed on the buffer layer 141.

A switching active layer 152 of the switching transistor 150 and the driving active layer 162 of the driving transistor 160 are disposed on the buffer layer 141. For example, the switching active layer 152 of the switching transistor 150 and the driving active layer 162 of the driving transistor 160 may be formed of an oxide semiconductor, respectively. Alternatively, the switching active layer 152 of the switching transistor 150 and the driving active layer 162 of the driving transistor 160 may be formed of amorphous silicon (a-Si), polycrystalline silicon (poly-Si), an organic semiconductor, or the like.

The gate insulating layer 142 is disposed on the switching active layer 152 of the switching transistor 150 and the driving active layer 162 of the driving transistor 160. The gate insulating layer 142 is a layer which electrically insulates the switching gate electrode 151 from the switching active layer 152 of the switching transistor 150 and electrically insulates the driving gate electrode 161 from the driving active layer 162 of the driving transistor 160. The gate insulating layer 142 may be formed of an insulating material. For example, the gate insulating layer 142 may be configured by an inorganic material, for example, configured by a single layer of silicon nitride (SiNx) or silicon oxide (SiOx) or a multiple layer of silicon nitride (SiNx) or silicon oxide (SiOx), but it is not limited thereto.

The switching gate electrode 151 of the switching transistor 150 and the driving gate electrode 161 of the driving transistor 160 are disposed on the gate insulating layer 142. The switching gate electrode 151 and the driving gate electrode 161 are disposed on the gate insulating layer 142 to be spaced apart from each other. The switching gate electrode 151 overlaps the switching active layer 152 and the driving gate electrode 161 overlaps the driving active layer 162.

Each of the switching gate electrode 151 and the driving gate electrode 161 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

A first interlayer insulating layer 143 is disposed on the switching gate electrode 151 and the driving gate electrode 161. The first interlayer insulating layer 143 insulates the driving gate electrode 161 from an intermediate metal layer IM. The first interlayer insulating layer 143 may be formed of an inorganic material, similar to the buffer layer 141. For example, the first interlayer insulating layer 143 may be configured by a single layer of silicon nitride (SiNx) or silicon oxide (SiOx) which is an inorganic material or a multiple layer of silicon nitride (SiNx) or silicon oxide (SiOx), but it is not limited thereto.

The intermediate metal layer IM is disposed on the first interlayer insulating layer 143. The intermediate metal layer IM is an electrode which overlaps the gate electrode of the driving transistor 160 to form a storage capacitor. Specifically, the driving gate electrode 161 and the intermediate metal layer IM overlap each other with the first interlayer insulating layer 143 therebetween to form the storage capacitor. However, the intermediate metal layer IM overlaps the other electrode to form a storage capacitor in various manners, but is not limited thereto.

The intermediate metal layer IM may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

A second interlayer insulating layer 144 is disposed on the intermediate metal layer IM. The second interlayer insulating layer 144 insulates the switching gate electrode 151 from the switching source electrode 153 and the switching drain electrode 154 of the switching transistor 150. The second interlayer insulating layer 144 insulates the intermediate metal layer IM from the driving source electrode and the driving drain electrode 164 of the driving transistor 160. The second interlayer insulating layer 144 may be formed of an inorganic material, similar to the buffer layer 141. For example, the second interlayer insulating layer 144 may be configured by a single layer of silicon nitride (SiNx) or silicon oxide (SiOx) which is an inorganic material or a multiple layer of silicon nitride (SiNx) or silicon oxide (SiOx), but it is not limited thereto.

The switching source electrode 153 and the switching drain electrode 154 of the switching transistor 150 are disposed on the second interlayer insulating layer 144. The driving source electrode and the driving drain electrode 164 of the driving transistor 160 are disposed on the second interlayer insulating layer 144. The switching source electrode 153 and the switching drain electrode 154 of the switching transistor 150 are disposed on the same layer to be spaced apart from each other. Even though in FIG. 3, the driving source electrode of the driving transistor 160 is omitted, the driving source electrode of the driving transistor 160 may be also disposed to be spaced apart from the driving drain electrode 164 on the same layer. The switching source electrode 153 and the switching drain electrode 154 may be electrically connected to the switching active layer 152 through a contact hole formed in the gate insulating layer 142, the first interlayer insulating layer 143, and the second interlayer insulating layer 144. The driving source electrode and the driving drain electrode 164 may be also electrically connected to the driving active layer 162 through a contact hole formed in the gate insulating layer 142, the first interlayer insulating layer 143, and the second interlayer insulating layer 144. The switching drain electrode 154 of the switching transistor 150 may be electrically connected to the driving gate electrode 161 of the driving transistor 160 through a contact hole formed in the first interlayer insulating layer 143 and the second interlayer insulating layer 144.

The switching source electrode 153 and the switching drain electrode 154 and the driving source electrode and the driving drain electrode 164 may be any one of various metal materials such as molybdenum (Mo), aluminum (Al), chrome (Cr), gold (Au), titanium (Ti), nickel (Ni), neo-dymium (Nd), and copper (Cu) or an alloy of two or more of them, or a multiple layer thereof, but it is not limited thereto.

Further, in this specification, even though it is described that the driving transistor 160 has a coplanar structure, various transistors such as a staggered structure may also be used. In the present specification, the transistor may also be formed with a bottom gate structure, as well as the top gate structure, but is not limited thereto.

A first pad PD1 and a second pad PD2 are formed on the second interlayer insulating layer 144.

First, referring to FIG. 4, the first pad PD1 is a pad which connects the plurality of first connection lines 181 and a plurality of wiring lines on the first plate pattern 121. The first pad PD1 may be electrically connected to the first connection line 181 through a contact hole formed in the planarization layer 146 and the passivation layer 145. A voltage supplied from the first connection line 181 may be transmitted from the first pad PD1 to the other configuration on the first plate pattern 121 through a wiring line formed on the first plate pattern 121. For example, a gate voltage, a high potential power voltage, a low potential power voltage, an emission control signal, or the like may be transmitted from the first connection line 181 to the sub pixel SPX on the first plate pattern 121 through the first pad PD1.

Referring to FIG. 3, the second pad PD2 is a pad which connects the plurality of second connection lines 182 and a plurality of wiring lines on the first plate pattern 121. The second pad PD2 may be electrically connected to the second connection line 182 through the contact hole formed in the planarization layer 146 and the passivation layer 145. A voltage supplied from the second connection line 182 may be transmitted from the second pad PD2 to the other configuration on the first plate pattern 121 through a wiring line formed on the first plate pattern 121. For example, the data voltage or the reference voltage may be transmitted from the second connection line 182 to the sub pixel SPX on the first plate pattern 121 through the second pad PD2.

The first pad PD1 and the second pad PD2 may be formed of the same material as the source electrode and the drain electrode. For example, the first pad PD1 and the second pad PD2 may be formed of any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

Referring to FIG. 3, the passivation layer 145 is formed on the switching transistor 150, the driving transistor 160, the first pad PD1, and the second pad PD2. The passivation layer 145 may protect components below the passivation layer 145 from moisture and oxygen. The passivation layer 145 may be formed of an inorganic material and configured by a single layer or a double layer, but is not limited thereto.

In the meantime, the gate insulating layer 142, the first interlayer insulating layer 143, the second interlayer insulating layer 144, and the passivation layer 145 are patterned to be the same as the buffer layer 141 to be formed only in an area overlapping the plurality of first plate patterns 121. The gate insulating layer 142, the first interlayer insulating layer 143, the second interlayer insulting layer 144, and the passivation layer 145 may be also formed of the inorganic material, similar to the buffer layer 141. Therefore, the gate insulating layer 142, the first interlayer insulating layer 143, the second interlayer insulating layer 144, and the passivation layer 145 may also be easily cracked to be damaged during the process of stretching the display device 100. Therefore, the gate insulating layer 142, the first interlayer insulating layer 143, the second interlayer insulating layer 144, and the passivation layer 145 are not formed in an area between the plurality of first plate patterns 121. However, the gate insulating layer 142, the first interlayer insulating layer 143, the second interlayer insulating layer 144, and the passivation layer 145 are patterned to have a shape of the plurality of first plate patterns 121 to be formed only above the plurality of first plate patterns 121.

The planarization layer 146 is formed on the passivation layer 145. The planarization layer 146 planarizes upper portions of the switching transistor 150 and the driving transistor 160. The planarization layer 146 may be configured by a single layer or a plurality of layers and may be formed of an organic material. Therefore, the planarization layer 146 may also be referred to as an organic insulating layer. For example, the planarization layer 146 may be formed of an acrylic organic material, but is not limited thereto.

Referring to FIG. 3, the planarization layer 146 may be disposed so as to cover top surfaces and side surfaces of the buffer layer 141, the gate insulating layer 142, the first interlayer insulating layer 143, the second interlayer insulating layer 144, and the passivation layer 145 on the plurality of first plate patterns 121. The planarization layer 146 encloses the buffer layer 141, the gate insulating layer 142, the first interlayer insulating layer 143, the second interlayer insulating layer 144, and the passivation layer 145 together with the plurality of first plate patterns 121. Specifically, the planarization layer 146 may be disposed so as to cover a top surface and a side surface of the passivation layer 145, a side surface of the first interlayer insulating layer 143, a side surface of the second interlayer insulating layer 144, a side surface of the gate insulating layer 142, a side surface of the buffer layer 141, and a part of a top surface of the plurality of first plate patterns 121.

Referring to FIG. 3, an inclination angle of the side surface of the planarization layer 146 may be smaller than an inclination angle formed by side surfaces of the buffer layer 141, the gate insulating layer 142, the first interlayer insulating layer 143, the second interlayer insulating layer 144, and the passivation layer 145. For example, the side surface of the planarization layer 146 may have a slope which is gentler than a slope formed by the side surface of the passivation layer 145, the side surface of the first interlayer insulating layer 143, the side surface of the second interlayer insulating layer 144, the side surface of the gate insulating layer 142, and the side surface of the buffer layer 141. Therefore, the connection line 180 which is disposed to be in contact with the side surface of the planarization layer 146 is disposed with a gentle slope so that when the display device 100 is stretched, the stress generated in the connection line 180 may be reduced. Accordingly, the planarization layer 146 may supplement a step on side surfaces of the buffer layer 141, the gate insulating layer 142, the first interlayer insulating layer 143, the second interlayer insulating layer 144, and the passivation layer 145.

Further, the side surface of the planarization layer 146 has a relatively gentle slope so that the crack of the connection line 180 or separation thereof from the side surface of the planarization layer 146 may be suppressed. Accordingly, the planarization layer 146 may enhance an adhesive strength of the connection line 180 disposed on a side surface of the planarization layer 146.

Referring to FIGS. 2 to 4, the plurality of connection lines 180 refers to wiring lines which electrically connect the pad on the plurality of first plate patterns 121 and the pad on the plurality of second plate patterns 123. The plurality of connection lines 180 are disposed on the plurality of first line patterns 122 and the plurality of second line patterns 124. The plurality of connection lines 180 may extend onto the plurality of first plate patterns 121 to be electrically connected to a pad on the plurality of first plate patterns 121, such as the first pad PD1 and the second pad PD2. The plurality of first line patterns 122 are not disposed in an area where the plurality of connection lines 180 is not disposed, among areas between the plurality of first plate patterns 121. Further, even though it is not illustrated in the drawing, the plurality of connection lines 180 are disposed on the plurality of second line patterns 124 to be electrically connected to a pad on the plurality of second plate patterns 123 and a pad on the plurality of first plate patterns 121. Therefore, the plurality of first line patterns 122 and the plurality of connection lines 180 and the plurality of second line patterns 124 and the plurality of connection lines 180 may be defined as line units LU.

The plurality of connection lines 180 includes the first connection line 181 and the second connection line 182. The first connection line 181 and the second connection line 182 are disposed between the plurality of first plate patterns 121, between the plurality of second plate patterns 123, and between the plurality of first plate patterns 121 and the plurality of second plate patterns 123. Specifically, the first connection line 181 refers to a wiring line extending in the first direction X between the plurality of first plate patterns 121, between the plurality of second plate patterns 123, and between the plurality of first plate patterns 121 and the plurality of second plate patterns 123, among the connection lines 180. The second connection line 182 refers to a wiring line extending in the second direction Y between the plurality of first plate patterns 121, between the plurality of second plate patterns 123, and between the plurality of first plate patterns 121 and the plurality of second plate patterns 123.

The plurality of connection lines 180 may be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

In the case of a general display device, various wiring lines such as a plurality of gate lines and a plurality of data lines extend between the plurality of sub pixels in a straight line and the plurality of sub pixels is connected to one signal line. Therefore, in the general display device, various wiring lines, such as a gate line, a data line, a high potential voltage line, and a reference voltage line, extend from one side to the other side of the display device without being disconnected on the substrate.

In contrast, in the display device 100 according to the exemplary embodiment of the present disclosure, various wiring lines, such as a gate line, a data line, a high potential voltage line, a reference voltage line, and an initialization voltage line having a straight line shape which are considered to be used for the general display device 100, are disposed on the plurality of first plate patterns 121 and the plurality of second plate patterns 123. That is, in the display device 100 according to the exemplary embodiment of the present disclosure, a straight-line shape wiring line is disposed only on the plurality of first plate patterns 121 and the plurality of second plate patterns 123.

In the display device 100 according to the exemplary embodiment of the present disclosure, the pads on the two adjacent first plate patterns 121 may be connected by the connection lines 180. Accordingly, the connection lines 180 electrically connect the first pads PD1 or the second pads PD2 on two first plate patterns 121 which are adjacent. Accordingly, the display device 100 according to the exemplary embodiment of the present disclosure may include a plurality of connection lines 180 which electrically connects various wiring lines, such as a gate line, a data line, a high potential voltage line, and a reference voltage line, between the plurality of first plate patterns 121. For example, the gate line may be disposed on the plurality of first plate patterns 121 disposed to be adjacent to each other in the first direction X and the first pad PD1 may be disposed on both ends of the gate line. In this case, the plurality of first pads PD1 on the plurality of first plate patterns 121 adjacent to each other in the first direction X may be connected to each other by the first connection line 181 which serves as a gate line. Therefore, the gate line disposed on the plurality of first plate patterns 121 and the first connection line 181 disposed on the first line pattern 122 may serve as one gate line. Further, wiring lines which extend in the first direction X, among all various wiring lines which may be included in the display device 100, such as an emission signal line, a low potential voltage line, and a high potential voltage line, may also be electrically connected by the first connection line 181, as described above.

Referring to FIGS. 2 to 4, some first connection lines 181, among the plurality of first connection lines 181 of the active area AA, may connect the first pads PD1 on two first plate patterns 121 which are disposed side by side, among the first pads PD1 on the plurality of first plate patterns 121 disposed to be adjacent in the first direction X. The first pads PD1 on the plurality of first plate patterns 121 disposed in the first direction X may be connected by the first connection line 181 serving as a gate line and transmit one gate voltage. However, the plurality of first connection lines 181 may serve an emission signal line, a high potential voltage line, or a low potential voltage line, as well as gate lines, but is not limited thereto.

Referring to FIGS. 2 to 3, some second connection lines 182, among the plurality of second connection lines 182, may connect the second pads PD2 on two first plate patterns 121 which are disposed side by side, among the second pads PD2 on the plurality of first plate patterns 121 disposed to be adjacent in the second direction Y. The internal line on the plurality of first plate patterns 121 disposed in the second direction Y may be connected by the plurality of second connection lines 182 serving as a data line and transmit one data voltage. However, the plurality of second connection lines 182 may serve as data lines, high potential voltage lines, low potential voltage lines, or reference line, but is not limited thereto.

Referring to FIG. 4, the first connection line 181 may be disposed to be in contact with a top surface and a side surface of the planarization layer 146 disposed on the first plate pattern 121. The first connection line 181 is disposed on the top surface of the first line pattern 122 and both ends thereof extend onto the first plate pattern 121 to be formed. Further, the second connection line 182 may be disposed to be in contact with a top surface and a side surface of the planarization layer 146 disposed on the first plate pattern 121. The second connection line 182 is also disposed on the top surface of the first line pattern 122 and both ends thereof extend onto the first plate pattern 121 to be formed.

Referring to FIG. 5, there is no need to dispose a rigid pattern in an area in which the first connection line 181 and the second connection line 182 are not disposed, so that the plurality first line patterns 122 is not disposed.

Referring to FIG. 3, a connection pad CP is disposed on the planarization layer 146. The connection pad CP is a pad for electrically connecting the driving transistor 160 and the low potential power line. The connection pad CP includes a first connection pad CP1 and a second connection pad CP2. The first connection pad CP1 may electrically connect the drain electrode of the driving transistor 160 and a p-electrode 175 of the LED 170 and the second connection pad CP2 may electrically connect the low potential power line and a n-electrode 174 of the LED 170. In this case, the second connection pad CP2 extends from the second connection line 182 which transmits the low potential power voltage to be integrally formed with the second connection line 182. Therefore, when the display device 100 is driven, different voltage levels applied to the first connection pad CP1 and the second connection pad CP2 are transmitted to the n-electrode 174 and the p-electrode 175, respectively, so that the LED 170 emits light.

A bank 147 is formed on the connection pad CP, the connection line 180, and the planarization layer 146. The bank 147 is a component which divides adjacent sub pixels SPX. The bank 147 is disposed so as to cover at least a part of the connection pad CP, the connection line 180, and the planarization layer 146. The bank 147 may be formed of an insulating material. The bank 147 includes the black material to block wiring lines which may be visible through the active area AA. For example, the bank 147 may be formed of a carbon-based mixture and specifically, include carbon black. However, it is not limited thereto and the bank 147 may be formed of a transparent insulating material. Even though in the drawing, it is illustrated that a height of the bank 147 is lower than a height of the LED 170, the present disclosure is not limited thereto and the height of the bank 147 may be equal to the height of the LED 170.

The LED 170 is disposed on the connection pad CP. The LED 170 includes an n-type layer 171, an active layer 172, a p-type layer 173, an n-electrode 174, and a p-electrode 175. The LED 170 of the display device 100 according to the exemplary embodiment of the present disclosure has a flip-chip structure in which the n-electrode 174 and the p-electrode 175 are formed together on one surface.

A p-type layer 173 is disposed on the connection pad CP and the n-type layer 171 is disposed on the p-type layer 173. The n-type layer 171 and the p-type layer 173 may be formed by doping n-type and p-type impurities into a specific material. For example, each of the n-type layer 171 and the p-type layer 173 may be layers formed by doping n-type and p-type impurities into a material such as gallium nitride (GaN), indium aluminum phosphide (InAlP), or gallium arsenide (GaAs). The p-type impurity may be magnesium, zinc (Zn), beryllium (Be), and the like, and the n-type impurity may be silicon (Si), germanium, tin (Sn), and the like, but are not limited thereto.

An active layer 172 is disposed between the n-type layer 171 and the p-type layer 173. The active layer 172 is an emission layer of the LED 170 which emits light and may be formed by a single layer or a multi-quantum well (MQW) structure, and for example, may be formed of indium gallium nitride (InGaN) or gallium nitride (GaN), but is not limited thereto.

As described above, the LED 170 of the display device 100 according to the exemplary embodiment of the present disclosure may be manufactured by sequentially laminating the n-type layer 171, the active layer 172, and the p-type layer 173, and then etching a predetermined part to form the n-electrode 174 and the p-electrode 175. In this case, the predetermined part which is a space for separating the n-electrode 174 and the p-electrode 175 from each other may be etched to expose a part of the n-type layer 171. In other words, the surfaces of the LED 170 on which the n-electrode 174 and the p-electrode 175 are disposed are not flat surfaces, but may have different heights.

As described above, the n-electrode 174 may be disposed on one surface of the exposed n-type layer 171 in the etched area. Further, the p-electrode 175 may be disposed on one surface of the p-type layer 173 disposed in an unetched area.

An adhesive layer AD is disposed between the LED 170 and the connection pad CP. The adhesive layer AD may be disposed between the n-electrode 174 and the p-electrode 175 of the LED 170 and the connection pad CP. The adhesive layer AD may be a conductive adhesive layer AD in which conductive balls are dispersed in an insulating base member. Therefore, when heat or a pressure is applied to the adhesive layer AD, the conductive balls are electrically connected in a portion applied with the heat or pressure to have a conductive property and an area which is not pressurized may have an insulation property. The n-electrode 174 and the p-electrode 175 may be electrically connected to the connection pad CP by means of the adhesive layer AD. For example, after applying the adhesive layer AD on the connection pad CP in an inkjet method, the LED 170 is transferred onto the adhesive layer AD and the LED 170 is pressurized and heated to electrically connect the connection pad CP and the p-electrode 175 and the n-electrode 174. However, a part of the adhesive layer AD excluding a part of the adhesive layer AD disposed between the n-electrode 174 and the connection pad CP and a part of the adhesive layer AD disposed between the p-electrode 175 and the connection pad CP has an insulating property. Even though in FIG. 3, it is illustrated that the adhesive layers AD which cover one pair of connection pads CP are connected to each other, the adhesive layers AD may be separated to be disposed in each of the pair of connection pads CP.

Next, the upper substrate 112 is disposed on the LED 170 and the lower substrate 111. The upper substrate 112 is a substrate which supports various components disposed below the upper substrate 112. For example, the upper substrate 112 may be formed by coating and curing a material which configures the upper substrate 112 above the lower substrate 111 and the first plate pattern 121.

The upper substrate 112 may be formed of the same material as the lower substrate 111. For example, the upper substrate 112 may be formed of a silicon rubber such as polydimethylsiloxane (PDMS) or an elastomer such as polyurethane (PU) or polytetrafluoroethylene (PTFE) and thus may have a flexible property. However, the material of the upper substrate 112 is not limited thereto.

Even though not illustrated in FIG. 3, a polarization layer may be disposed on the upper substrate 112. The polarization layer may perform a function which polarizes light incident from the outside of the display device 100 to reduce the external light reflection. Further, an optical film, and the like other than the polarization layer may be disposed on the upper substrate 112.

A filling layer 190 is disposed between the lower substrate 111 and the upper substrate 112. The filling layer 190 may be fully filled in an empty space between the lower substrate 111 and the upper substrate 112. For example, the filling layer 190 may be configured by a curable adhesive. Specifically, the material which configures the filling layer 190 is coated on the entire surface of the lower substrate 111 and then is cured so that the filling layer 190 may be disposed between the components disposed on the upper substrate 112 and the lower substrate 111. For example, the filling layer 190 may be an optically clear adhesive (OCA) and may be configured by an acrylic adhesive, a silicon-based adhesive, and a urethane-based adhesive.

In the display device 100 according to the exemplary embodiment of the present disclosure, a plurality of holes CS and a plurality of conductive members CM are formed in the peak area PA of the line unit LU including the plurality of connection lines 180 and the plurality of first line patterns 122 and the plurality of connection lines 180 and the plurality of second line patterns 124. By doing this, the progress of the crack of the line unit LU may be interrupted and resistance of the connection line 180 may be improved. Hereinafter, a plurality of holes CS and a plurality of conductive members CM will be described in detail with reference to FIGS. 6 to 8B.

Figure 6:
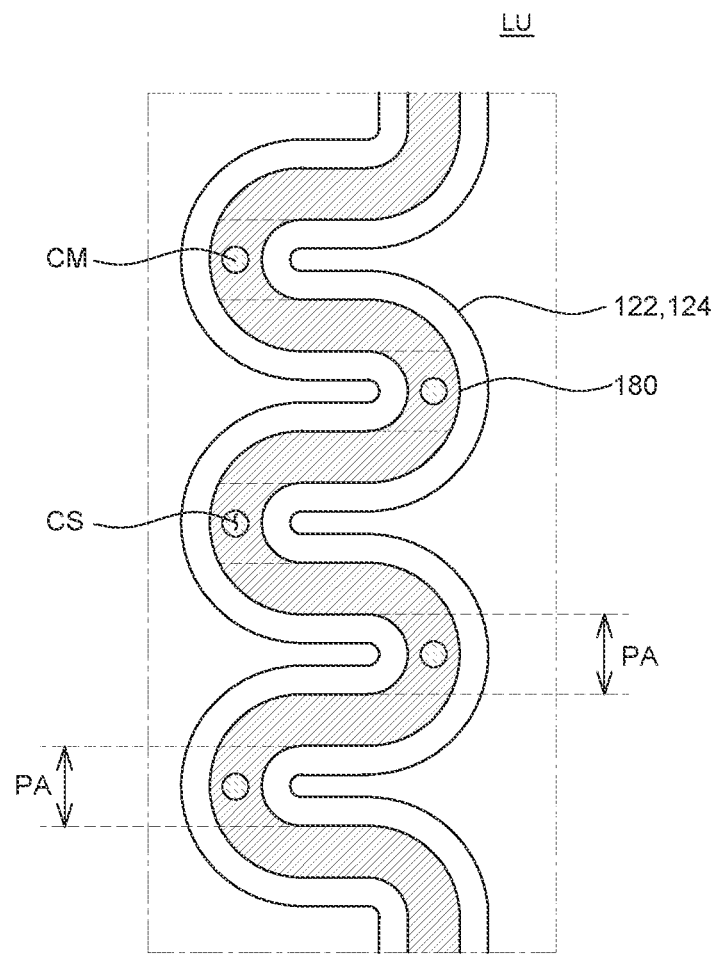
FIG. 6 is an enlarged plan view of a line unit of a display device according to an exemplary embodiment of the present disclosure.
Figure 7:
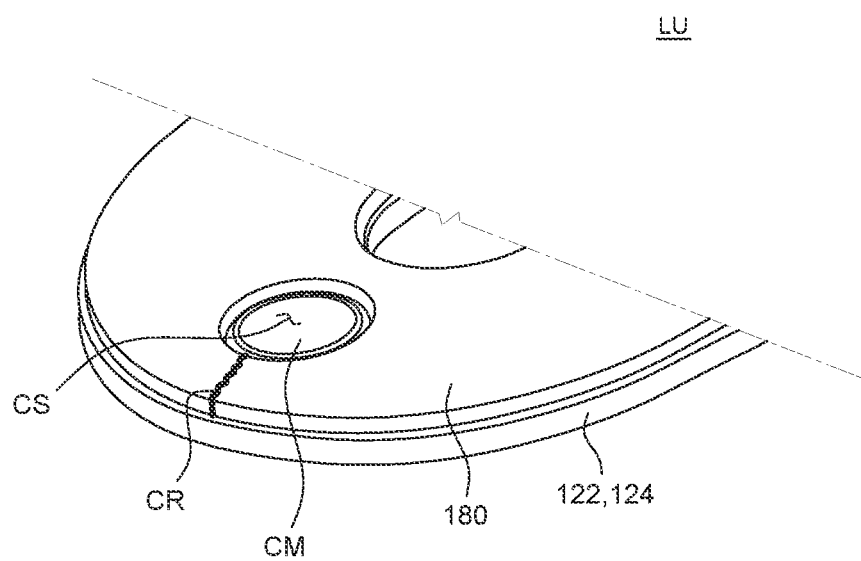
FIG. 7 is a perspective view of a peak area of a line unit of a display device according to an exemplary embodiment of the present disclosure.
Figure 8A:
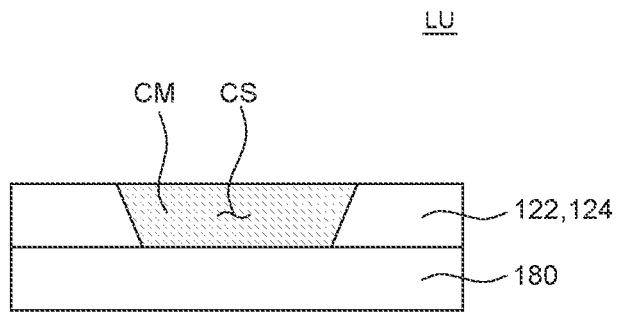
FIGS. 8A and 8B are cross-sectional views of a line unit of a display device according to an exemplary embodiment of the present disclosure.
Figure 8B:
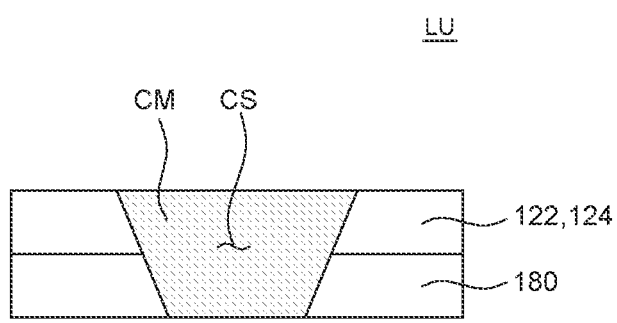

FIG. 6 is an enlarged plan view of a line unit of a display device according to an exemplary embodiment of the present disclosure. FIG. 7 is a perspective view of a peak area of a line unit of a display device according to an exemplary embodiment of the present disclosure. FIGS. 8A and 8B are cross-sectional views of a line unit of a display device according to an exemplary embodiment of the present disclosure.

Referring to FIGS. 2, 6, and 7 together, the plurality of line units LU including the plurality of connection lines 180 and the plurality of line patterns 122 and 124 includes a peak area PA. The peak area PA refers to an area of the plurality of line units LU having a largest amplitude. The plurality of line units LU is formed with a sinusoidal shape and a part of the plurality of line units LU having the largest amplitude may be defined as a peak area PA. The plurality of line units LU may be defined as including a linear portion in a straight-line shape and a curved portion in a semicircular shape. The plurality of linear portions and the plurality of curved portions may be alternately disposed and connected to each other to form the plurality of line units LU. The peak area PA may be located the curved portion of the plurality of line units LU. The peak area PA may correspond to a semicircular-shaped portion of the plurality of line units LU. A curvature of the peak area PA of the plurality of line units LU is greater than the curvature of the rest area of the plurality of line units LU. When the display device 100 is stretched, the most stress may be concentrated in the peak area PA of the plurality of line units LU.

Referring to FIGS. 8A and 8B together, the plurality of holes CS are formed in the peak area PA of the line unit LU and the conductive member CM is disposed in the plurality of holes CS. The plurality of holes CS may be formed in at least a part of the line unit LU. A diameter of the plurality of holes CS may be smaller than a width of the line unit LU. The plurality of holes CS may overlap the inside of the line unit LU.

For example, referring to FIG. 8A, the plurality of holes CS may be formed only in the plurality of connection lines 180 overlapping the peak area PA. The plurality of holes CS are not formed in the plurality of line patterns 122 and 124, but is formed only in the connection lines 180. Therefore, the conductive member CM is filled in the space formed by the plurality of holes CS and the plurality of line patterns 122 and 124 so as not to flow to the outside of the hole CS.

As another example, referring to FIG. 8B, the plurality of holes CS may be formed in the plurality of connection lines 180 and the plurality of line patterns 122 and 124 overlapping the peak area PA. The hole CS may be disposed to extend from the plurality of connection lines 180 to the plurality of line patterns 122 and 124. The holes CS formed in the plurality of connection lines 180 and the holes CS formed in the plurality of line patterns 122 and 124 overlap each other to communicate with each other. In this case, the hole CS is formed in the plurality of connection lines 180, first, and the line patterns 122 and 124 are subjected to the dry etching with respect to the hole CS formed in the connection lines 180 to form a plurality of holes CS. In the meantime, even though in FIG. 8B, it is illustrated that the hole CS is formed to entirely pass through the plurality of line patterns 122 and 124, the hole CS may be formed only in some of the plurality of line patterns 122 and 124, rather than passing through all the plurality of line patterns 122 and 124, but is not limited thereto.

Referring to FIG. 7, when the display device 100 is deformed, if the plurality of holes CS is formed in the peak area PA in which the stress is concentrated, the crack CR generated in the peak area PA may be suppressed from progressing to the entire line unit LU. The plurality of holes CS interrupt the crack CR from progressing to the entire line unit LU to reduce the disconnection of the line unit LU due to the crack CR. If the crack CR is generated in the line unit LU in the peak area PA, the crack CR may progress to the plurality of holes CS. The plurality of holes CS may block the crack CR of the line unit LU from being transmitted to the other part of the line unit LU by passing through the plurality of holes CS. Accordingly, the plurality of holes CS may serve as crack stoppers of the line unit LU.

In the meantime, a resistance of the connection line 180 in a part of the connection line 180 of the line unit LU in which the hole CS is formed may be increased. Therefore, the conductive member CM is formed in the plurality of holes CS to lower the resistance of the connection line 180. The conductive member CM is disposed so as to be filled in the hole CS to be electrically connected to the connection line 180. Accordingly, the conductive member CM serves as the connection line 180 to reduce the resistance of the connection line 180 in the vicinity of the plurality of holes CS. The conductive member CM is formed of a conductive material having a flexibility to be in contact with the connection line 180 in the hole CS to lower the resistance. For example, the conductive member CM is formed of a liquid metal to be filled in the hole CS, but is not limited thereto.

When a crack CR is generated in the peak area PA of the line unit LU, the plurality of holes CS reduces a stress of the peak area PA to reduce the additional damage of the line unit LU in the peak area PA. The plurality of holes CS relieve a stress which is concentrated in the peak area PA of the line unit LU which is partially disconnected to reduce the additional crack CR generated in the peak area PA later.

Hereinafter, a stress reduction effect of the plurality of holes CS will be described with reference to FIGS. 9A to 11D.

Figure 9A:
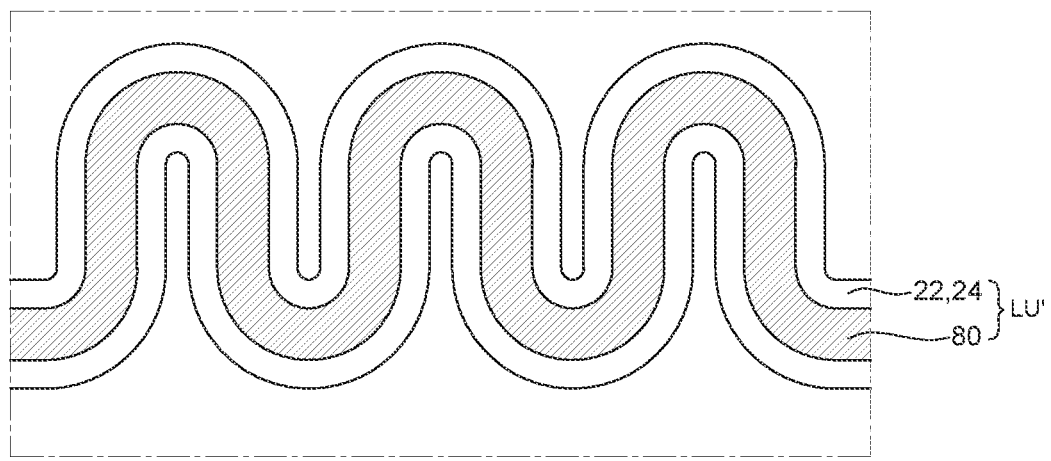
FIG. 9A is a plan view of a line unit of a display device according to a comparative embodiment.
Figure 9B:
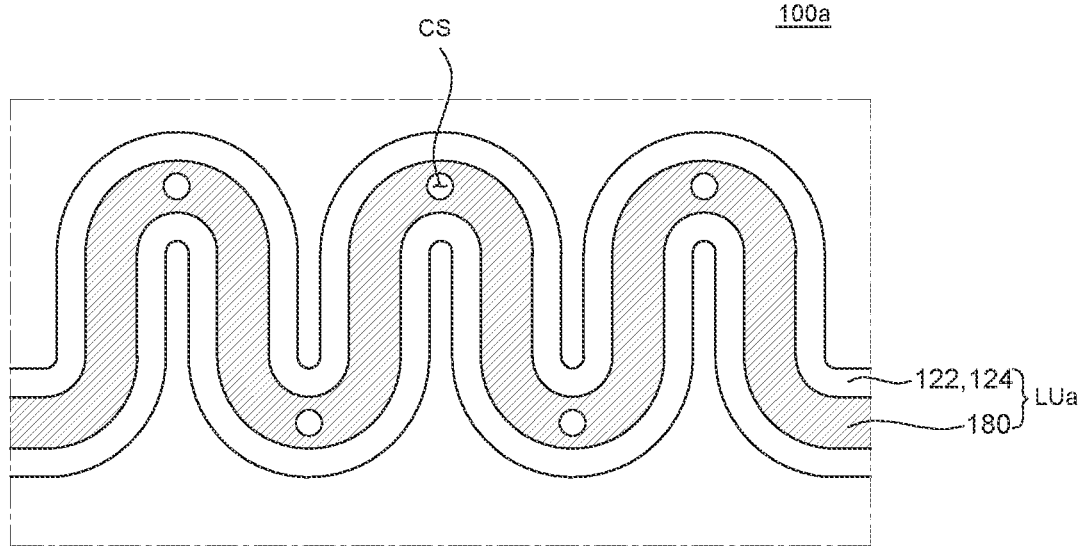
FIGS. 9B to 9D are plan views of a line unit of a display device according to various exemplary embodiments of the present disclosure.
Figure 9C:
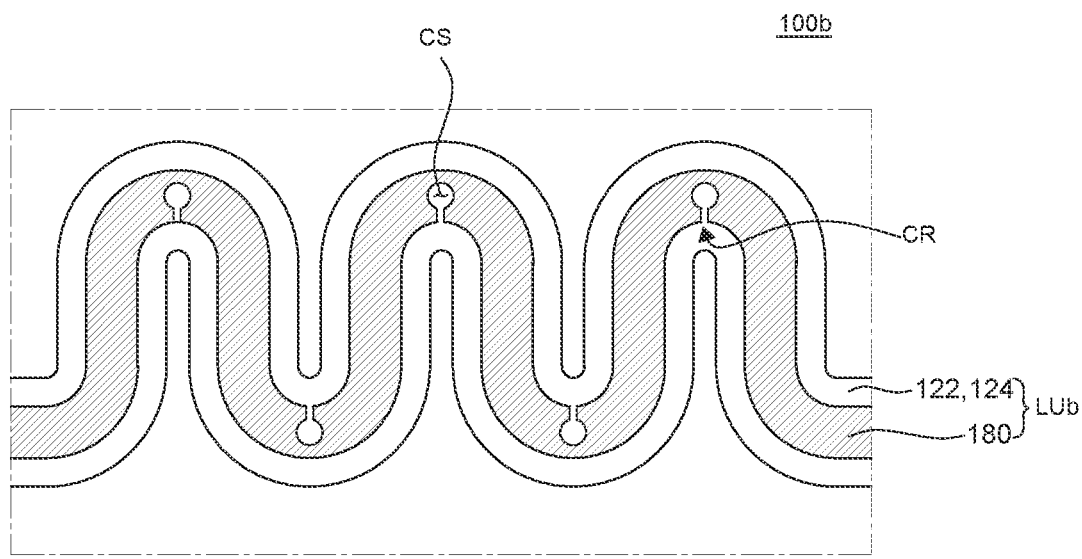
Figure 9D:
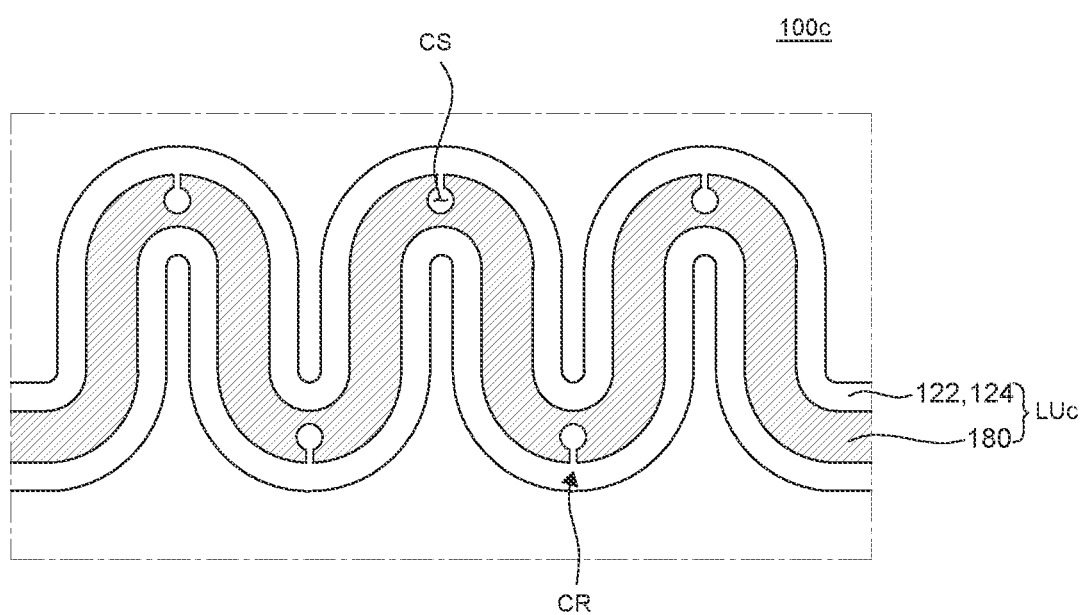

FIG. 9A is a plan view of a line unit of a display device according to a comparative embodiment. FIGS. 9B to 9D are plan views of a line unit of a display device according to various exemplary embodiments of the present disclosure. FIGS. 10A to 10D are views for explaining a stress simulation result of a line unit of a display device according to a comparative embodiment and exemplary embodiments. FIGS. 11A to 11D are views for explaining a strain simulation result of a line unit of a display device according to a comparative embodiment and exemplary embodiments.

Referring to FIG. 9A, a line unit LU' of a display device 10 according to a comparative embodiment has a wavy shape, for example, a sinusoidal shape. The line unit LU' of the comparative embodiment includes line patterns 22 and 24 and a connection line 80 on the line patterns 22 and 24, but does not include a hole CS.

Referring to FIG. 9B, a line unit LUa of a display device 100a according to Exemplary Embodiment 1 is substantially the same as the line unit Lua of the display device 100 according to the exemplary embodiment of the present disclosure and has a wavy shape. As compared with the line unit Lu' of the comparative embodiment, the line unit LUa of Exemplary Embodiment 1 further includes a plurality of holes CS which passes through the connection line 180 in the peak area PA of the line unit LUa.

Referring to FIG. 9C, a line unit LUb of a display device 100b according to Exemplary Embodiment 2 has a wavy shape which is the same as the line unit LUa of Exemplary Embodiment 1 and includes a plurality of holes CS disposed in the connection line 180 in the peak area PA. However, in the line unit LUb of Exemplary Embodiment 2, a crack CR is generated from an inner circumferential surface IS of the peak area PA to the plurality of holes CS so that a part of the line unit LUb of the inner circumferential surface IS of the peak area PA is separated. The line unit LUb of Exemplary Embodiment 2 may be a line unit LUb which is substantially the same as the line unit LU of the display device 100 according to the exemplary embodiment of the present disclosure and further has a crack CR formed therein.

Referring to FIG. 9D, a line unit LUc of a display device 100c according to Exemplary Embodiment 3 has a wavy shape which is the same as the line unit LUb of Exemplary Embodiment 2 and includes a plurality of holes CS disposed in the connection line 180 in the peak area PA. As compared with the line unit LUb of Exemplary Embodiment 2, a crack CR is generated from an outer circumferential surface OS of the peak area PA to the plurality of holes CS in the line unit LUc of Exemplary Embodiment 3 so that a part of the line unit LUc of the outer circumferential surface OS of the peak area PA is separated. The line unit LUc of Exemplary Embodiment 3 may be a line unit LUc which is substantially the same as the line unit LU of the display device 100 according to the exemplary embodiment of the present disclosure and further has a crack CR formed therein.

Referring to FIGS. 10A to 10D, a simulation result obtained by measuring stresses of line units LU', LUa, LUb, and LUc of the comparative embodiment, Exemplary Embodiment 1, Exemplary Embodiment 2, and Exemplary Embodiment 3 can be confirmed. When a width of the connection line 180 was 6 um and a radius of the hole CS was 1 um, and line units LU', LUa, LUb, and LUc were stretched by 40%, a stress was measured. The stress refers to a resistance generated in a material in response to the magnitude of an external force, such as compression, tension, bending, or torsion applied to the material. As the color displayed in the area, the closer to brighter, the higher the stress and the closer to darker, the lower the stress.

Figure 10A:
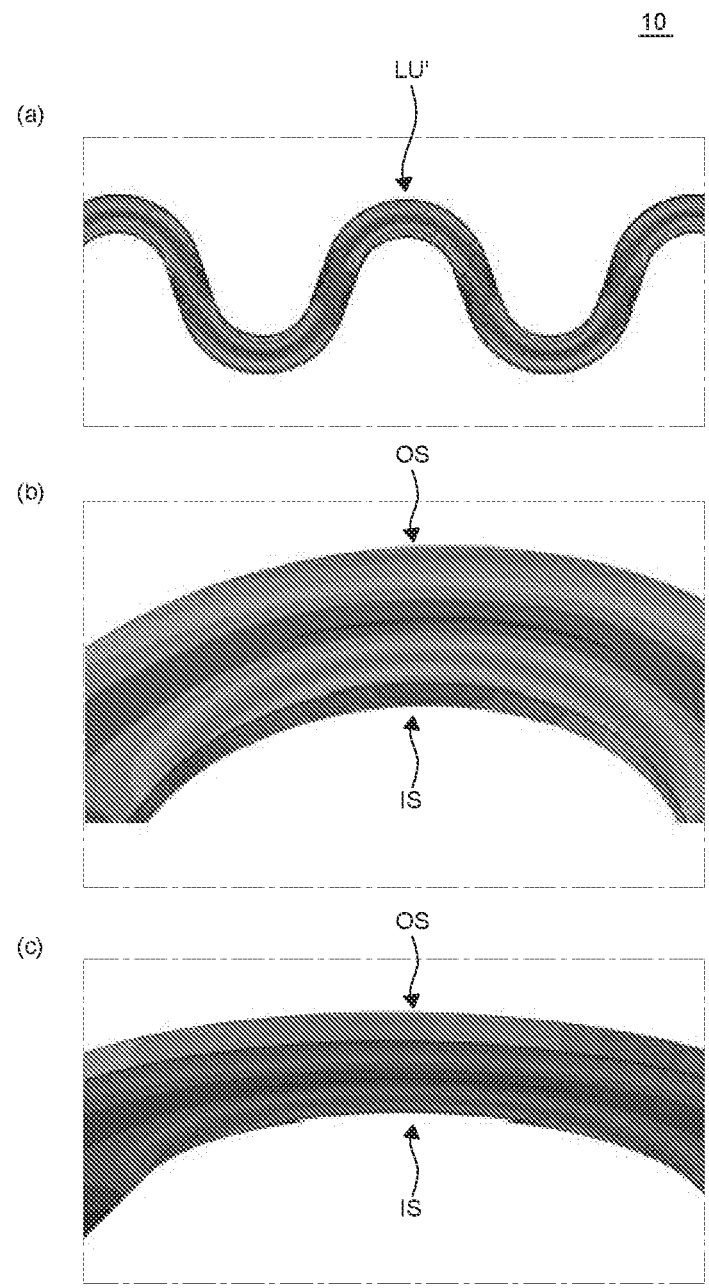
FIGS. 10A, 10B, 10C, and 10D are views for explaining a stress simulation result of a line unit of a display device according to a comparative embodiment and exemplary embodiments.

First, referring to FIG. 10A, when the line unit LU' of the comparative embodiment is deformed, a simulation result obtained by measuring the stress is illustrated. Part (a) of FIG. 10A is a plan view of the line unit LU', part (b) of FIG. 10A is a perspective view of enlarging an inner circumferential surface IS of the peak area PA, and part (c) of FIG. 10A is a perspective view of enlarging an outer circumferential surface OS of the peak area PA.

As a result of measuring the stress of the line unit LU' of the comparative embodiment, it is confirmed that the stress is the highest in the peak area PA. For example, the stress is entirely higher in the inner circumferential surface IS and the outer circumferential surface OS of the peak area PA and specifically, a tensile stress applied to the inner circumferential surface IS of the peak area PA may be the highest. The tensile stress is a resistance generated when the line unit LU' is stretched and it is confirmed that when the line unit LU' is stretched, the inner circumferential surface IS of the peak area PA having the largest amplitude is extended the most and has a high tensile stress. Further, it is confirmed that a compressive stress applied to the outer circumferential surface OS of the peak area PA, among the stresses, is also entirely higher than that of a center portion of the line unit LU'. The compressive stress is a resistance generated when the line unit LU' is compressed and it is confirmed that when the line unit LU' is stretched, the outer circumferential surface OS of the peak area PA having the largest amplitude is compressed the most and has a high compressive stress.

Figure 10B:
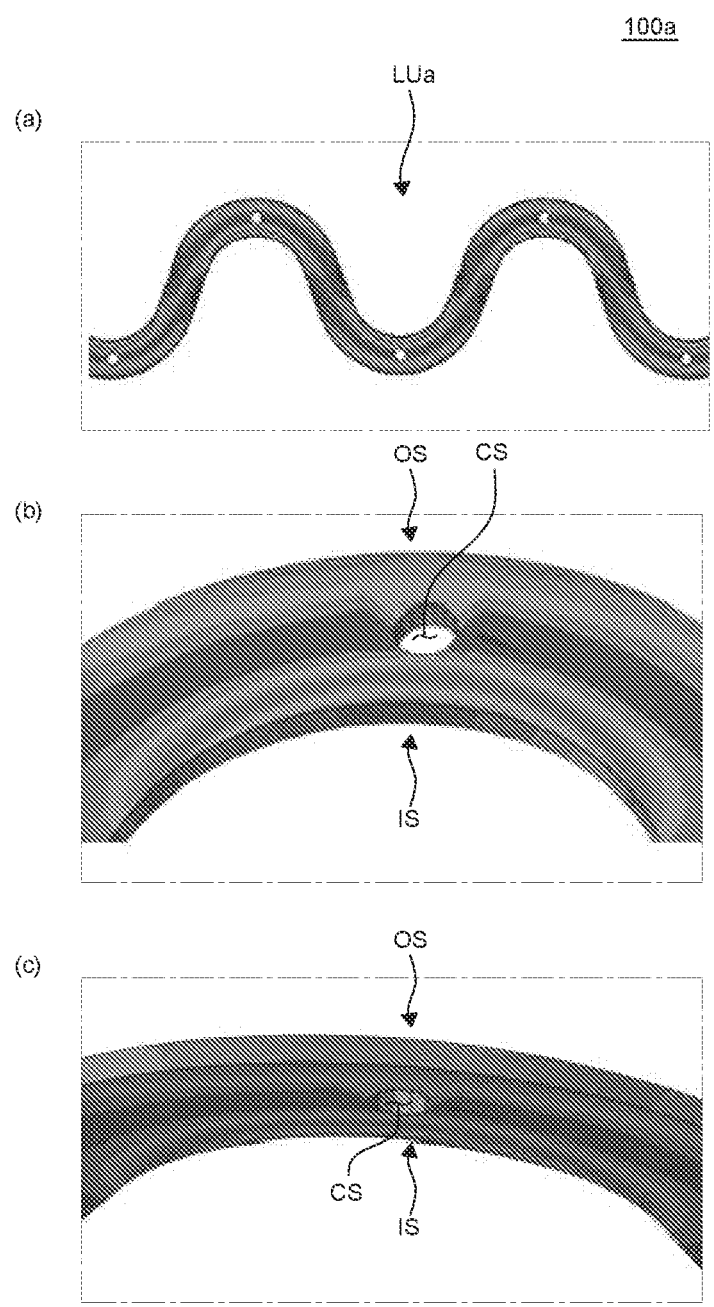

Referring to FIGS. 11A to 11D, a simulation result obtained by measuring a stress when a line unit LUa of Exemplary Embodiment 1 is deformed is illustrated. Part (a) of FIG. 10B is a plan view of the line unit Lua, part (b) of FIG. 10B is a perspective view of enlarging an inner circumferential surface IS of the peak area PA, and part (c) of FIG. 10C is a perspective view of enlarging an outer circumferential surface OS of the peak area PA.

The line unit LUa of Exemplary Embodiment 1 entirely has a stress distribution similar to the line unit LU' of the comparative embodiment. The line unit LUa of Exemplary Embodiment 1 entirely has a high stress in the peak area PA. It is confirmed that the tensile stress applied to the inner circumferential surface IS of the peak area PA is the highest and then the compressive stress applied to the outer circumferential surface OS of the peak area is higher.

Figure 10C:
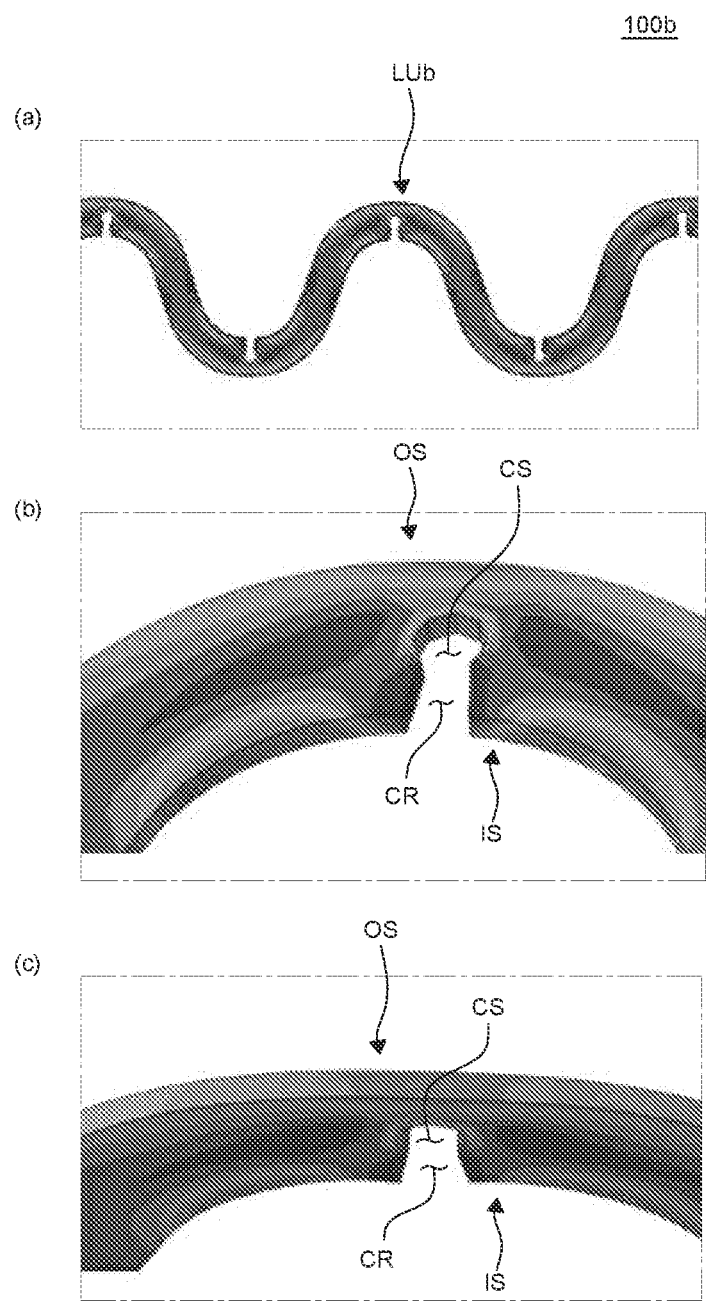

Referring to FIG. 10C, a simulation result obtained by measuring a stress when a line unit LUb of Exemplary Embodiment 2 is deformed is illustrated. Part (a) of FIG. 10C is a plan view of the line unit LUb, part (b) of FIG. 10C is a perspective view of enlarging an inner circumferential surface IS of the peak area PA, and part (c) of FIG. 10C is a perspective view of enlarging an outer circumferential surface OS of the peak area PA.

As compared with the line units LU' and LUa of the comparative embodiment and Exemplary Embodiment 1, it is confirmed that the stress of the line unit LUb of Exemplary Embodiment 2 is relieved in the peak area PA. As a part of the line unit LUb of the peak area PA is separated due to the crack CR formed from the inner circumferential surface IS of the peak area PA to the hole CS, the peak area PA may be more easily deformed. The line units LU' and LUa of the comparative embodiment and Exemplary Embodiment 1 have a generally bright stress area in the peak area PA, but the line unit LUb of Exemplary Embodiment 2 has more relatively dark stress area in the peak area PA so that it is confirmed that in the line unit LUb of Exemplary Embodiment 2, stress is dispersed due to the hole CS and the crack CR.

Figure 10D:
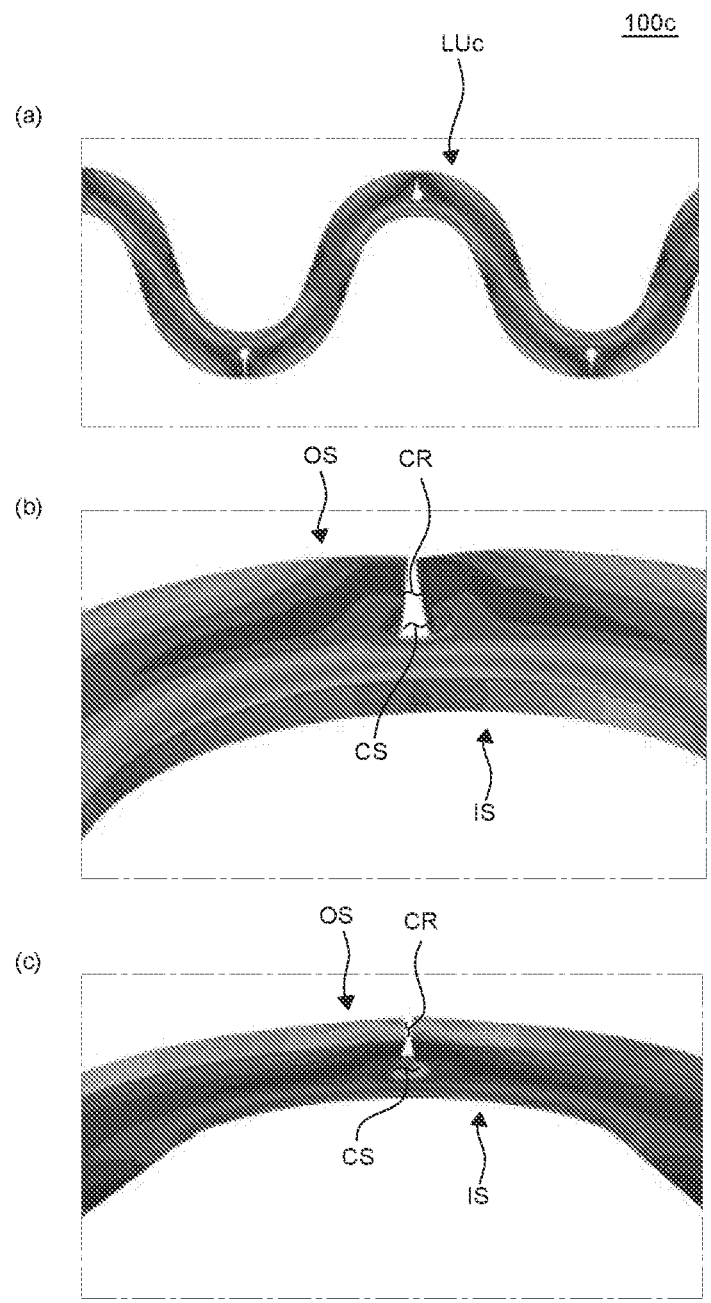

Referring to FIG. 10D, a simulation result obtained by measuring a stress when a line unit LUc of Exemplary Embodiment 3 is deformed is illustrated. Part (a) of FIG. 10D is a plan view of the line unit Luc, part (b) of FIG. 10D is a perspective view of enlarging an inner circumferential surface IS of the peak area PA, and part (c) of FIG. 10D is a perspective view of enlarging an outer circumferential surface OS of the peak area PA.

As compared with the line units LU' and LUa of the comparative embodiment and Exemplary Embodiment 1, it is confirmed that the stress of the line unit LUc of Exemplary Embodiment 3 is relieved in the peak area PA. A part of the line unit LUc of the peak area PA is separated due to the crack CR formed from the outer circumferential surface OS of the peak area PA to the hole CS and the stress of the peak area PA may be relieved. An area of the brighter stress area of the inner circumferential surface IS of the line unit LUc of Exemplary Embodiment 3 may be smaller than areas of the brighter stress areas of the inner circumferential surface IS of the line units LU' and LUa of the comparative embodiment and Exemplary Embodiment 1.

Accordingly, when the comparative embodiment and Exemplary Embodiment 1 are compared, even though a plurality of holes CS which serves as a crack stopper is formed in the line unit LUa, as in Exemplary Embodiment 1, the stress of the line unit LUa is not increased, but maintains a similar level. Therefore, a plurality of holes CS is formed in the peak area PA so that the crack CR is reduced from propagating to the entire line unit LUa to disconnect the line unit LUa, without increasing the stress of the line unit LUa.

Like the line units LUb and LUc of Exemplary Embodiments 2 and 3, when the crack CR is generated to the hole CS in the inner circumferential surface IS or the outer circumferential surface OS of the line units LUb and LUc, the stress of the peak area PA may be relieved. Therefore, the disconnection of the line units LUb and LUc due to the additional crack CR generated from the hole CS to the remaining parts of the line units LUb and LUc may also be reduced.

Next, referring to FIGS. 11A to 11D, a simulation result obtained by measuring strains, that is, deformation rates of line units LU', LUa, LUb, and LUc of the comparative embodiment, Exemplary Embodiment 1, Exemplary Embodiment 2, and Exemplary Embodiment 3 can be confirmed. When a width of the connection line 180 was 6 um and a radius of the hole CS was 1 um, and line units LU', LUa, LUb, and LUc were stretched by 40%, a strain was measured. A strain refers to a deformation rate of a material when an external force, such as compression, tension, bending, or torsion is applied to the material and also may be referred to as deformation. As the color displayed in the area, the closer to brighter, the higher the strain and the closer to darker, the lower the strain.

Figure 11A:
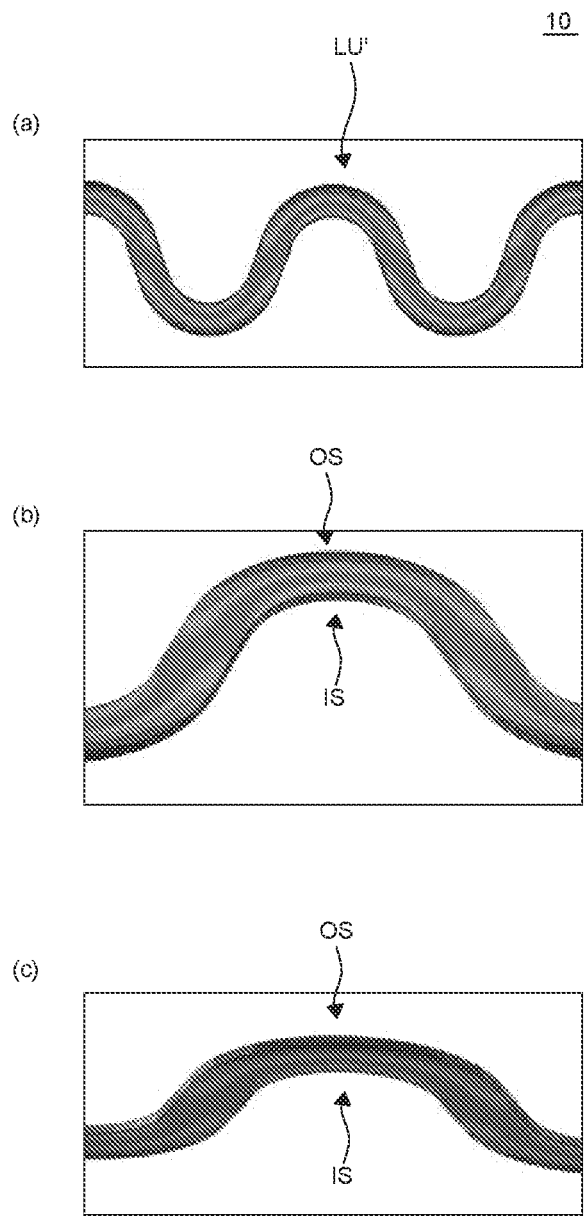
FIGS. 11A, 11B, 11C, and 11D are views for explaining a strain simulation result of a line unit of a display device according to a comparative embodiment and exemplary embodiments.

First, referring to FIG. 11A, when the line unit LU' of the comparative embodiment is deformed, a simulation result obtained by measuring the strain is illustrated. Part (a) of FIG. 11A is a plan view of the line unit LU', part (b) of FIG. 11A is a perspective view of enlarging an inner circumferential surface IS of the peak area PA, and part (c) of FIG. 11A is a perspective view of enlarging an outer circumferential surface OS of the peak area PA.

As a result of measuring the strain of the line unit LU' of the comparative embodiment, it is confirmed that the strain is the highest in the peak area PA. For example, a strain applied to the inner circumferential surface IS of the peak area PA, that is, a tensile strain may be the highest. The tensile strain refers to a strain which a tensile force is applied. In contrast, it is confirmed that a compressive strain applied to the outer circumferential surface OS of the peak area PA which is deformed in a compression direction is the lowest. The compressive strain refers to a strain generated when the line unit LU' is compressed.

Figure 11B:
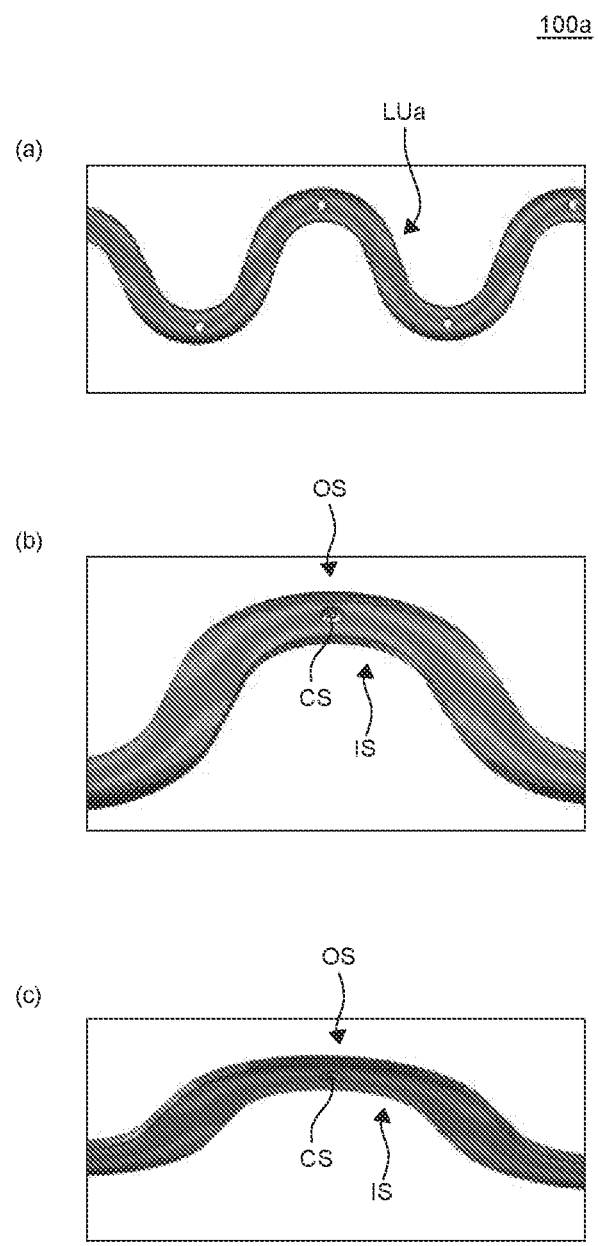

Referring to FIG. 11B, a simulation result obtained by measuring a strain when a line unit LUa of Exemplary Embodiment 1 is deformed is illustrated. Part (a) of FIG. 11B is a plan view of the line unit LUa, part (b) of FIG. 11B is a perspective view of enlarging an inner circumferential surface IS of the peak area PA, and part (c) of FIG. 11B is a perspective view of enlarging an outer circumferential surface OS of the peak area PA.

The line unit LUa of Exemplary Embodiment 1 has a strain distribution similar to the line unit LU' of the comparative embodiment. The line unit LUa of Exemplary Embodiment 1 has a high strain in the inner circumferential surface IS of the peak area PA and has a low strain in the outer circumferential surface OS. It is confirmed that the tensile strain applied to the inner circumferential surface IS of the peak area PA is the highest and then the compressive strain applied to the outer circumferential surface OS of the peak area PA is higher.

Figure 11C:
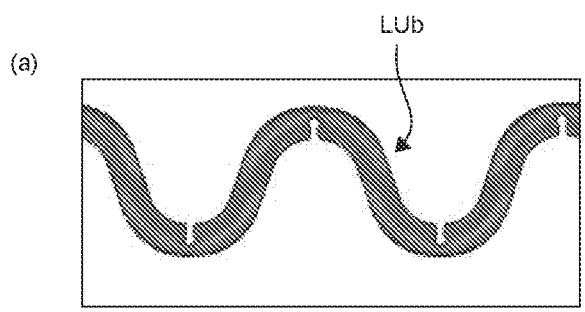
Figure 11C:
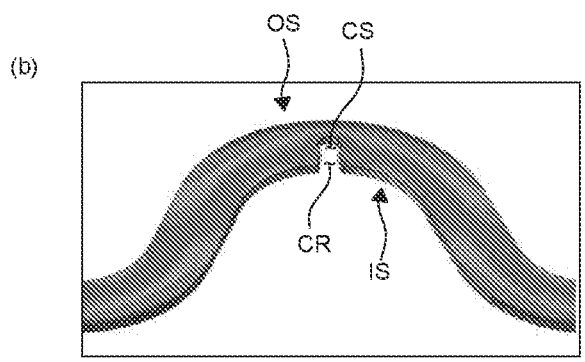
Figure 11C:
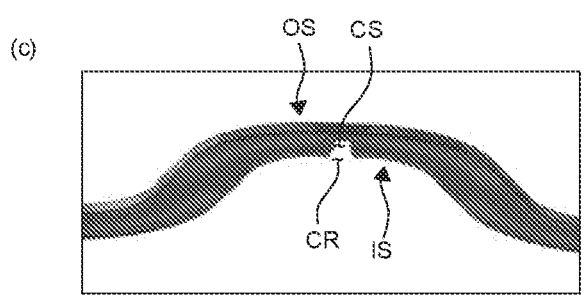

Referring to FIG. 11C, a simulation result obtained by measuring a strain when a line unit LUb of Exemplary Embodiment 2 is deformed is illustrated. Part (a) of FIG. 11C is a plan view of the line unit LUb, part (b) of FIG. 11C is a perspective view of enlarging an inner circumferential surface IS of the peak area PA, and part (c) of FIG. 11C is a perspective view of enlarging an outer circumferential surface OS of the peak area PA.

As compared with the line units LU' and LUa of the comparative embodiment and Exemplary Embodiment 1, it is confirmed that the strain of the line unit LUb of Exemplary Embodiment 2 is relieved in the inner circumferential surface IS of the peak area PA. As a part of the line unit LUb of the peak area PA is separated due to the crack CR formed from the inner circumferential surface IS of the peak area PA to the hole CS, the inner circumferential surface IS of the peak area PA may be more easily deformed. The line units LU' and LUa of the comparative embodiment and Exemplary Embodiment 1 have a generally bright strain area in the peak area PA, but the line unit LUb of Exemplary Embodiment 2 has more relatively dark strain area in the peak area PA so that it is confirmed that in the line unit LUb of Exemplary Embodiment 2, strain is relieved due to the hole CS and the crack CR.

Figure 11D:
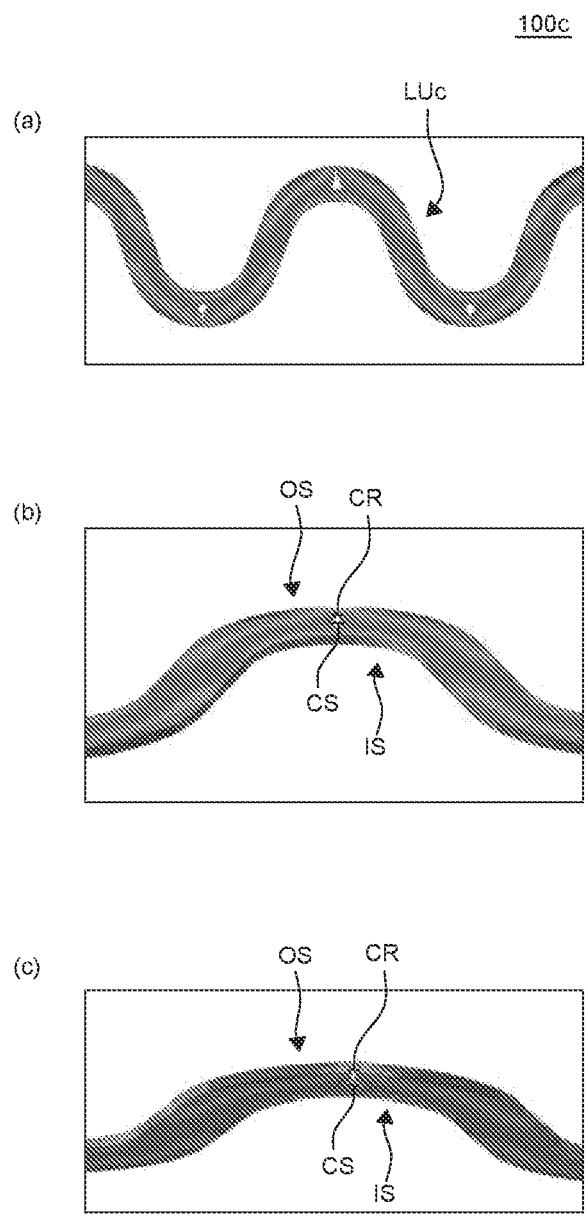

Referring to FIG. 11D, a simulation result obtained by measuring a strain when a line unit LUc of Exemplary Embodiment 3 is deformed is illustrated. Part (a) of FIG. 11D is a plan view of the line unit LUc, part (b) of FIG. 11D is a perspective view of enlarging an inner circumferential surface IS of the peak area PA, and part (c) of FIG. 11D is a perspective view of enlarging an outer circumferential surface OS of the peak area PA.

As compared with the line units LU' and LUa of the comparative embodiment and Exemplary Embodiment 1, it is confirmed that the strain of the line unit LUc of Exemplary Embodiment 3 is slightly relieved in the inner circumferential surface IS of the peak area PA. A part of the line unit LUc of the peak area PA is separated due to the crack CR formed from the outer circumferential surface OS of the peak area PA to the hole CS and the strain of the peak area PA may be partially relieved. An area of the brighter strain area of the inner circumferential surface IS of the line unit LUc of Exemplary Embodiment 3 may be smaller than areas of the brighter strain areas of the inner circumferential surface IS of the line units LU' and LUa of the comparative embodiment and Exemplary Embodiment 1.

Accordingly, when the comparative embodiment and Exemplary Embodiment 1 are compared, even though a plurality of holes CS which serves as a crack stopper is formed in the line unit LUa, as in Exemplary Embodiment 1, the strain of the line unit LUa is not increased, but maintains a similar level. Therefore, a plurality of holes CS is formed in the peak area PA so that the crack CR is reduced from propagating to the entire line unit LUa to disconnect the line unit LUa, without increasing the strain of the line unit LUa.

Like the line units LUb and LUc of Exemplary Embodiments 2 and 3, when the crack CR is generated to the hole Cs in the inner circumferential surface IS or the outer circumferential surface OS of the line units LUb and LUc, the strain of the peak area PA may be relieved. Therefore, the disconnection of the line units LUb and LUc due to the other crack CR generated from the hole CS to the remaining parts of the line units LUb and LUc may be minimized.

Accordingly, in the display device 100 according to the exemplary embodiment of the present disclosure, a plurality of holes CS is formed in the peak area PA of the line unit LU to block the crack CR from propagating to the other part of the line unit LU even though the crack CR is generated in the peak area PA. The peak area PA of the line unit LU in which the most stress is concentrated may be vulnerable to the crack CR. When a hole CS is formed in the middle of the line unit LU in the peak area PA, the crack CR which begins from the outer surface of the line unit LU may be continued to the hole CS. However, a part of the crack CR which reaches the hole CS cannot propagate to the other part of the line unit LU due to the hole CS. Further, as described above with respect to FIGS. 10 to 17, after forming the crack CR directed to the hole CS, the stress of the line unit LU is relieved in the vicinity of the hole CS so that the additional crack CR may be reduced from being generated in the vicinity of the hole CS. Accordingly, the plurality of holes CS is formed in the peak area PA of the line unit LU in which the stress is concentrated, and thus the progress of the crack CR of the line unit LU to the entire line unit LU may be blocked. Further, even though the crack CR is generated in the line unit LU, the stress of the line unit LU is relieved to reduce the generation of the additional crack CR and the disconnection of the line unit LU.

In the display device 100 according to the exemplary embodiment of the present disclosure, the conductive member CM is formed in the hole CS of the line unit LU so that the resistance of the plurality of connection lines 180 in the vicinity of the hole CS may be reduced. When the hole CS is formed in the middle of the plurality of connection lines 180 of the line unit LU, the resistance of the connection line 180 may be increased by the hole CS. Therefore, a conductive member CM, such as a liquid metal is formed in the hole CS to allow the conductive member CM to serve as the connection line 180. The conductive member CM is filled in the hole CS to minimize the increase of the resistance of the plurality of connection lines 180 in the vicinity of the hole CS.

The exemplary embodiments of the present disclosure can also be described as follows:

According to an aspect of the present disclosure, a display device includes a stretchable lower substrate, a plurality of plate patterns which is disposed on the lower substrate to be spaced apart from each other, a plurality of line units disposed between the plurality of plate patterns, a plurality of holes disposed in a peak area of the plurality of line units, and a plurality of conductive members which is filled in the plurality of holes.

The plurality of line units may include a plurality of line patterns which connects the plurality of plate patterns on the lower substrate, and a plurality of connection lines disposed on the plurality of line patterns.

The plurality of holes may be disposed in the plurality of connection lines.

The plurality of holes may be disposed to extend from the plurality of connection lines to the plurality of line patterns.

The plurality of conductive members may be electrically connected to the plurality of connection lines.

The plurality of conductive members may be formed of a liquid metal.

A diameter of each of the plurality of holes may be smaller than widths of the plurality of line units.

The plurality of line units may have a sinusoidal shape and the peak area may correspond to an area of the plurality of line units having the largest amplitude.

The plurality of holes may be a crack stopper of the plurality of line units.

According to another aspect of the present disclosure, a display device includes a stretchable lower substrate, a plurality of plate patterns which is disposed on the lower substrate to be spaced apart from each other, a plurality of line patterns disposed between the plurality of plate patterns, a plurality of connection lines which is disposed on the plurality of line patterns and has a wavy shape, a plurality of crack stoppers disposed in a peak area of the plurality of connection lines, and a plurality of conductive members filled in the plurality of crack stoppers. The plurality of crack stoppers is holes which pass through the plurality of connection lines.

The plurality of crack stoppers may be configured to block a crack which is directed to the plurality of crack stoppers in an inner circumferential surface or an outer circumferential surface of the peak area of the plurality of connection lines from propagating to the other part of the peak area.

The plurality of crack stoppers may be further disposed in the plurality of line patterns and the plurality of crack stoppers which is disposed in the plurality of line patterns and the plurality of connection lines may overlap each other.

The plurality of conductive members may be configured to be in contact with the plurality of connection lines in the plurality of crack stoppers to reduce resistance of the plurality of connection lines.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts in the equivalent scope of the present disclosure should be construed as falling within the scope of the present disclosure.

What is claimed is:

1. A display device, comprising:
a stretchable lower substrate;
a plurality of plate patterns on the stretchable lower substrate, the plurality of plate patterns spaced apart from each other;
a plurality of line units between the plurality of plate patterns, each line unit including a first U shaped portion having a curved peak area pointing towards a first direction in a plan view of the display device and a second U shaped portion having a curved peak area pointing towards a second direction that is opposite the first direction in the plan view, the first U shaped portion connected to the second U shaped portion in the plan view;
a plurality of holes including a first hole in the curved peak area of the first U shaped portion and a second hole in the curved peak area of the second U shaped portion; and
a plurality of conductive members which are filled in the plurality of holes.

2. The display device according to claim 1, wherein the plurality of line units comprises:
a plurality of line patterns which connects the plurality of plate patterns on the stretchable lower substrate; and
a plurality of connection lines on the plurality of line patterns.

3. The display device according to claim 2, wherein the plurality of holes are in the plurality of connection lines.

4. The display device according to claim 3, wherein the plurality of holes extend from the plurality of connection lines to the plurality of line patterns.

5. The display device according to claim 3, wherein the plurality of conductive members are electrically connected to the plurality of connection lines.

6. The display device according to claim 1, wherein the plurality of conductive members comprise a liquid metal.

7. The display device according to claim 1, wherein a diameter of each of the plurality of holes is smaller than widths of the plurality of line units.

8. The display device according to claim 1, wherein the plurality of line units has a sinusoidal shape and the peak area corresponds to an area of the plurality of line units having a largest amplitude.

9. The display device according to claim 8, wherein the plurality of holes are a crack stopper of the plurality of line units.

10. A display device, comprising:
a stretchable lower substrate;
a plurality of plate patterns on the stretchable lower substrate, the plurality of plate patterns spaced apart from each other;
a plurality of line patterns between the plurality of plate patterns;
a plurality of connection lines on the plurality of line patterns, each connection line including a first U shaped portion having a curved peak area pointing towards a first direction in a plan view of the display device and a second U shaped portion having a curved peak area pointing towards a second direction that is opposite the first direction in the plan view, the first U shaped portion connected to the second U shaped portion in the plan view;
a plurality of crack stoppers including a first crack stopper in the curved peak area of the first U shaped portion and a second crack stopper in the curved peak area of the second U shaped portion; and
a plurality of conductive members filled in the plurality of crack stoppers, wherein the plurality of crack stoppers comprise holes which pass through the plurality of connection lines.

11. The display device according to claim 10, wherein the plurality of crack stoppers are configured to block a crack which is directed to the plurality of crack stoppers in an inner circumferential surface or an outer circumferential surface of the peak area of the plurality of connection lines from propagating to another part of the peak area.

12. The display device according to claim 10, wherein the plurality of crack stoppers are further disposed in the plurality of line patterns and the plurality of crack stoppers which are disposed in the plurality of line patterns and each of the plurality of connection lines overlaps each other.

13. The display device according to claim 10, wherein the plurality of conductive members are in contact with the plurality of connection lines in the plurality of crack stoppers to reduce resistance of the plurality of connection lines.

* * * * *